US012777699B2

(12) United States Patent
Iwamoto

(10) Patent No.: US 12,777,699 B2
(45) Date of Patent: Oct. 27, 2026

(54) SEMICONDUCTOR DEVICE AND METHOD OF MANUFACTURING SAME

(71) Applicant: ROHM CO., LTD., Kyoto (JP)

(72) Inventor: Kunihiko Iwamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 307 days.

(21) Appl. No.: 18/736,206

(22) Filed: Jun. 6, 2024

(65) Prior Publication Data

US 2024/0421198 A1 Dec. 19, 2024

(30) Foreign Application Priority Data

Jun. 15, 2023 (JP) ................................. 2023-098343

(51) Int. Cl.

| | |
|---|---|
| ***H01L 29/40*** | (2006.01) |
| ***H10D 30/01*** | (2025.01) |
| ***H10D 30/65*** | (2025.01) |
| ***H10D 64/00*** | (2025.01) |
| ***H10W 10/00*** | (2026.01) |
| ***H10W 10/13*** | (2026.01) |

(52) U.S. Cl.

CPC ....... *H10D 64/111* (2025.01); *H10D 30/0281* (2025.01); *H10D 30/65* (2025.01); *H10W 10/0125* (2026.01); *H10W 10/13* (2026.01)

(58) Field of Classification Search

CPC .. H10D 30/0281; H10D 30/65; H10D 62/107; H10D 62/116; H10D 62/126; H10D 62/157; H10D 64/111; H10D 64/112; H10D 64/115; H10D 64/518; H10W 10/0125; H10W 10/13

See application file for complete search history.

(56) References Cited

U.S. PATENT DOCUMENTS

2013/0075877 A1* 3/2013 Sakai .................. H10D 12/421 257/E29.327
2022/0359673 A1* 11/2022 Zhao .................. H10D 30/0281
2023/0155025 A1* 5/2023 Wada .................. H10D 30/603 257/335
2025/0386557 A1* 12/2025 Kishimoto ........... H10D 30/668

* cited by examiner

*Primary Examiner* — Jaehwan Oh

(74) *Attorney, Agent, or Firm* — Rabin & Berdo, P.C.

(57) ABSTRACT

A semiconductor device includes: a semiconductor substrate; a semiconductor layer that is located over the semiconductor substrate and includes a drain region, a source region, a drift region, and a channel region; an insulating film that is in contact with the semiconductor layer and is located over the channel region; a first interlayer insulating film that covers the insulating film; and a field plate that is located over the first interlayer insulating film, overlaps the drift region, and is electrically connected to the drain region.

20 Claims, 21 Drawing Sheets

1A

SEMICONDUCTOR DEVICE AND METHOD OF MANUFACTURING SAME

CROSS-REFERENCE TO RELATED APPLICATION

This application is based upon and claims the benefit of priority from Japanese Patent Application No. 2023-098343, filed on Jun. 15, 2023, the entire contents of which are incorporated herein by reference.

TECHNICAL FIELD

The present disclosure relates to a semiconductor device and a method of manufacturing the same.

BACKGROUND

In the related art, a semiconductor device including a semiconductor layer, a first electrode, a second electrode, a lateral element, a LOCOS oxide film, and a resistive field plate is disclosed. The first electrode is formed over a surface of the semiconductor layer. The second electrode is formed over the surface of the semiconductor layer at an interval from the first electrode. The lateral element is formed in a region between the first electrode and the second electrode at a surface layer of the surface of the semiconductor layer and is electrically connected to the first electrode and the second electrode. The LOCOS oxide film separates parts constituting the lateral element at the surface of the semiconductor layer. The resistive field plate is formed over the LOCOS oxide film.

BRIEF DESCRIPTION OF DRAWINGS

The accompanying drawings, which are incorporated in and constitute a part of the specification, illustrate embodiments of the present disclosure.

DETAILED DESCRIPTION

Figure 1:
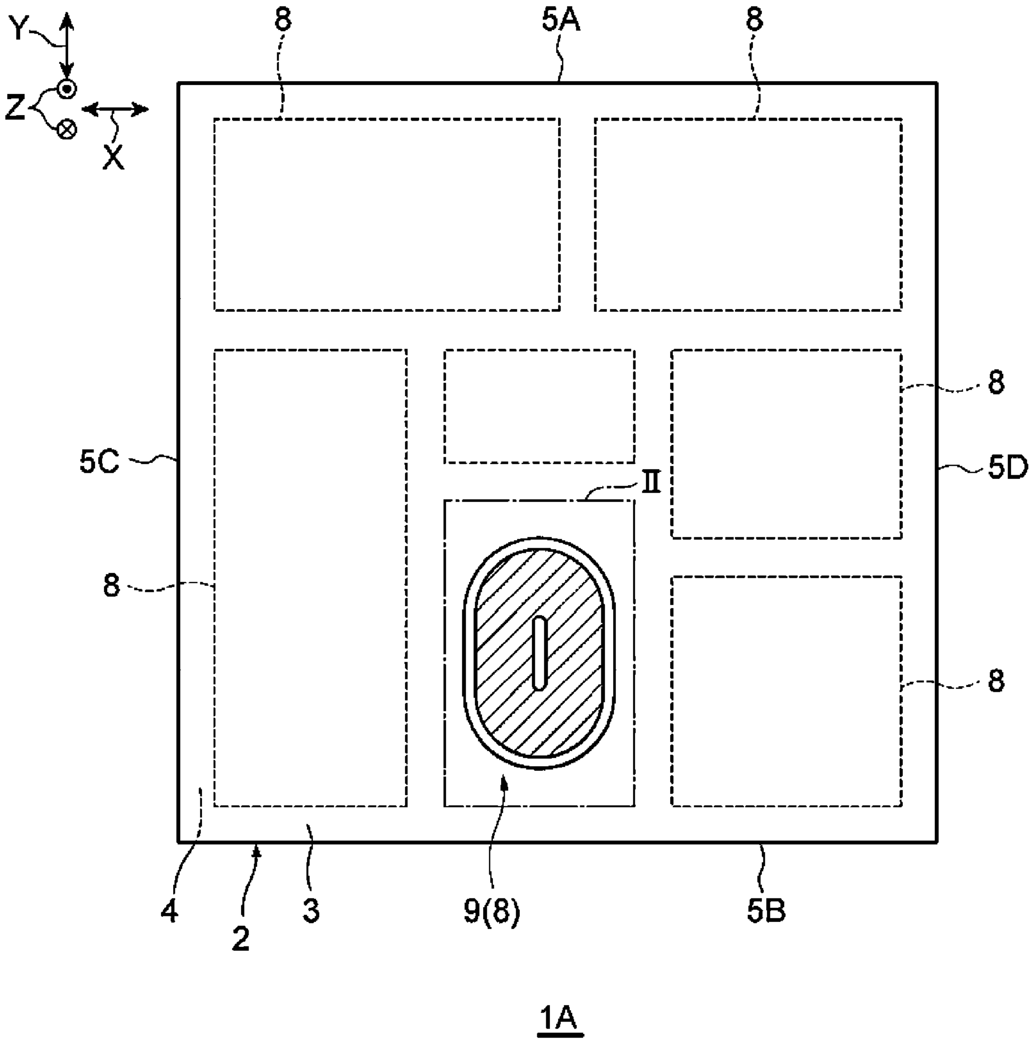
FIG. 1 is a plan view showing a chip of a semiconductor device according to a first embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described in detail with reference to the accompanying drawings. In the following description, the same elements or elements having the same function are denoted by the same reference numerals, and duplicate explanation will be omitted. In the present disclosure, "same" and words similar thereto are not limited to "exactly the same." Further, since the drawings are for conceptually explaining the embodiments, the dimensions and ratios of the illustrated constituent elements may differ from the actual ones.

First Embodiment

Figure 2:
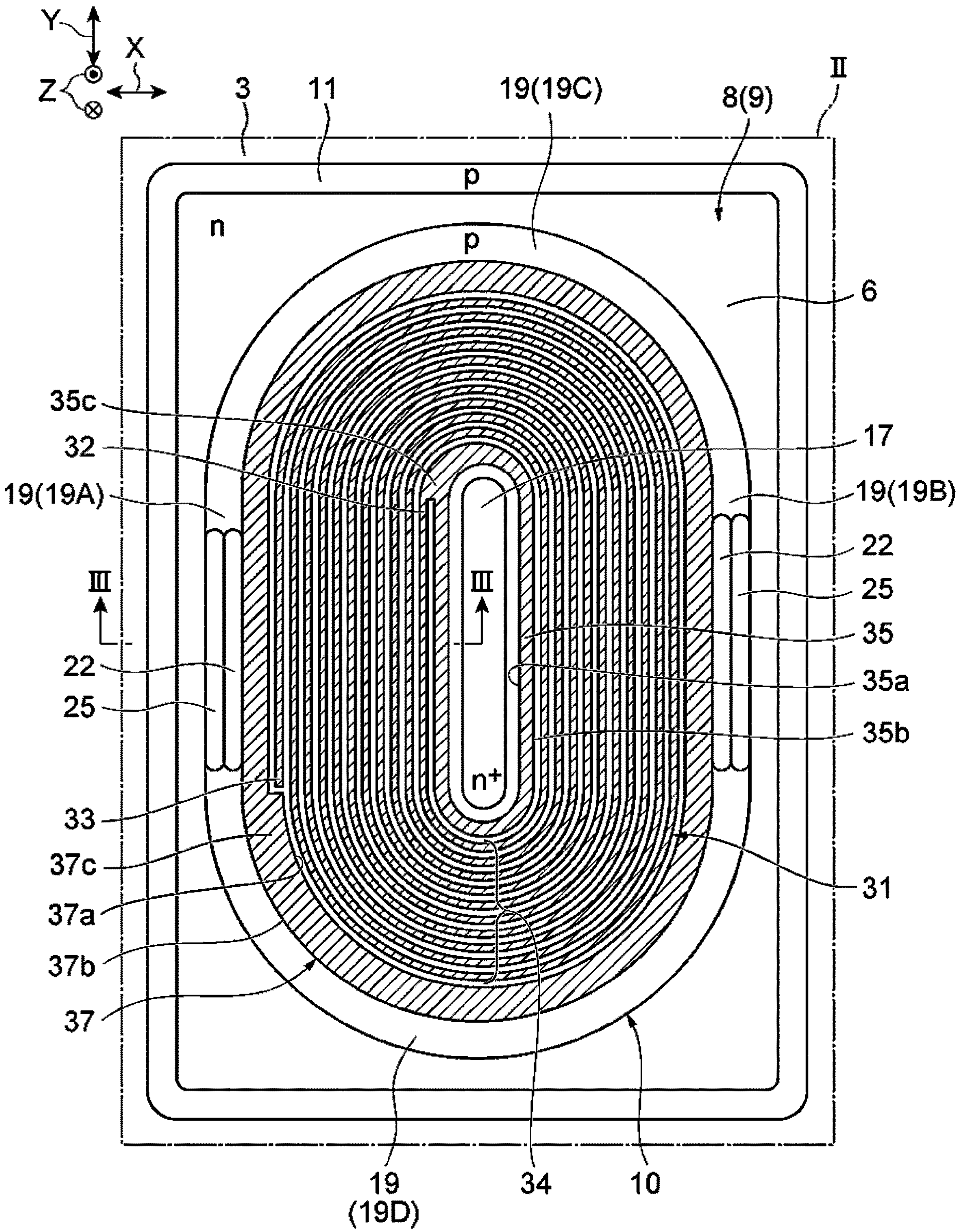
FIG. 2 is an enlarged plan view of region II shown in FIG. 1.
Figure 3:
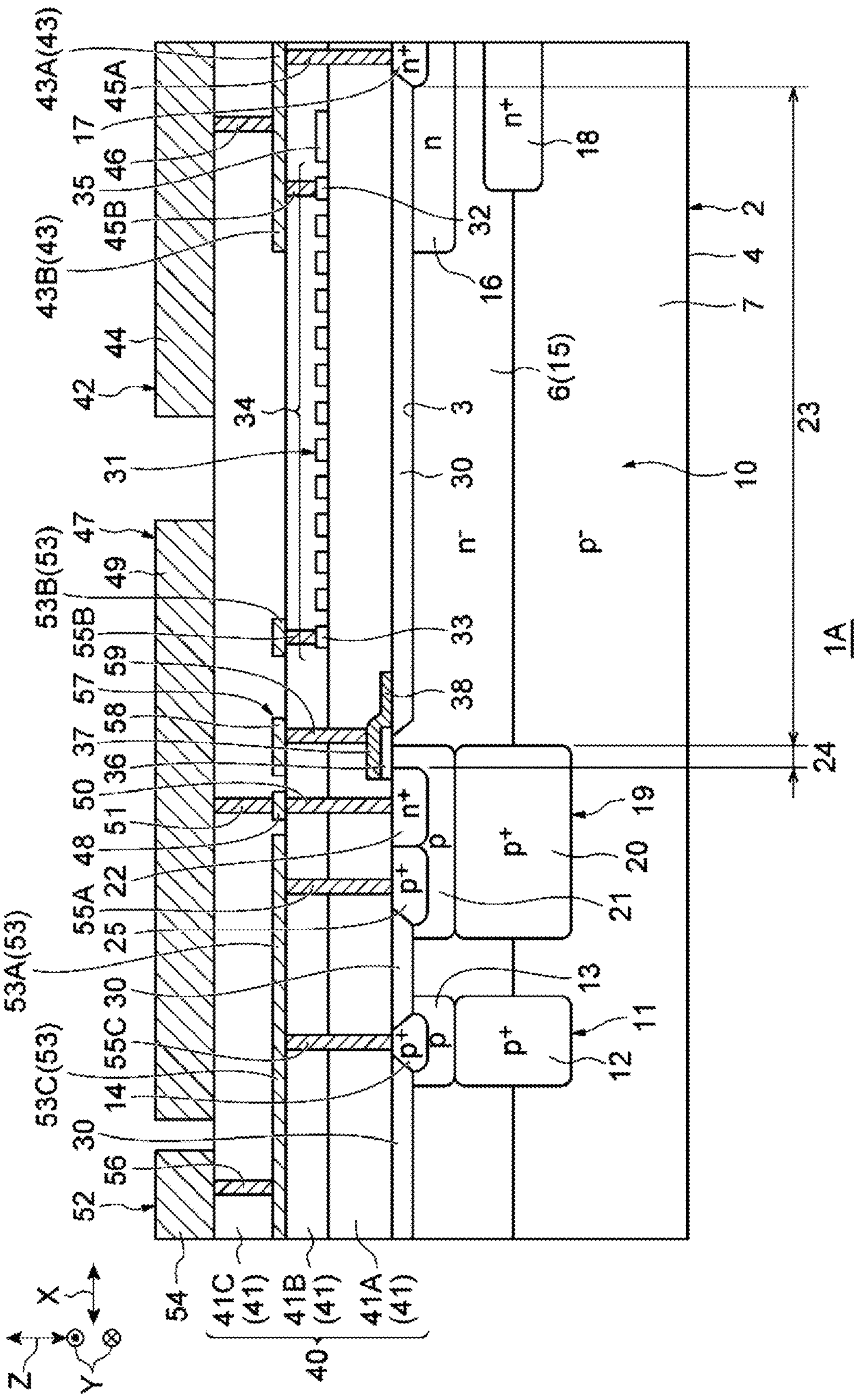
FIG. 3 is a schematic cross-sectional view of region III shown in FIG. 2.

FIG. 1 is a plan view showing a chip of a semiconductor device according to a first embodiment. FIG. 2 is an enlarged view of region II shown in FIG. 1. FIG. 3 is a schematic cross-sectional view of region III shown in FIG. 2. As shown in FIG. 1, the semiconductor device 1A includes a silicon chip 2 (semiconductor chip) having a rectangular parallelepiped shape. The chip 2 is one of a plurality of devices formed at a silicon wafer having a diameter of, for example, 300 mm (approximately 12 inches).

The chip 2 includes a first main surface 3 and a second main surface 4, which are a pair of main surfaces, and a first side surface 5A, a second side surface 5B, a third side surface 5C, and a fourth side surface 5D that connect the first main surface 3 and the second main surface 4. Hereinafter, an extension direction of the first side surface 5A and the second side surface 5B in a plan view is referred to as a first direction X, an extension direction of the third side surface 5C and fourth side surface 5D in a plan view is referred to as a second direction Y, and a normal direction of the first main surface 3 and the second main surface 4 is referred to as a third direction Z. The second direction Y is a direction intersecting the first direction X in a plan view, and the third direction Z corresponds to a thickness direction of the chip 2.

Although the first main surface 3 and the second main surface 4 are formed in a square shape when viewed from the third direction Z, the shape is not limited thereto. In the first embodiment, the first main surface 3 is a top surface, and the second main surface 4 is a bottom surface. Therefore, a configuration located near the first main surface 3 in the third direction Z corresponds to a configuration located at a side of the top surface (upper side) of the semiconductor device 1A, and a configuration located near the second main surface 4 in the third direction Z corresponds to a configuration located at a side of the bottom surface (lower side) of the semiconductor device 1A.

The semiconductor device 1A includes a first semiconductor region 6 located at an upper region within the chip 2. The first semiconductor region 6 is a region having a first conductivity type and has a layered shape extending along the first main surface 3. For this reason, the first semiconductor region 6 may also be called a semiconductor layer. The first semiconductor region 6 is at least a portion of an epitaxial semiconductor layer. The first semiconductor region 6 is exposed from the first main surface 3, the first side surface 5A, the second side surface 5B, the third side surface 5C, and the fourth side surface 5D. A thickness of the first semiconductor region 6 is, for example, 5 μm or more and 20 μm or less. In the first embodiment, the first conductivity type is n-type.

The semiconductor device 1A includes a second semiconductor region 7 located at a lower region within the chip 2. The second semiconductor region 7 is a region having a second conductivity type and fixed at a predetermined potential. The second semiconductor region 7 has a layered shape extending along the second main surface 4. The second semiconductor region 7 is exposed from the second main surface 4 and the first to fourth side surfaces 5A to 5D. In the first embodiment, the second semiconductor region 7 is fixed at a back gate potential. The back gate potential may be a reference potential that serves as a reference for circuit operation, or may be a ground potential. In the first embodiment, the second conductivity type is p-type.

The second semiconductor region 7 is connected to the first semiconductor region 6. A thickness of the second semiconductor region 7 may be 50 μm or more and 400 μm or less. The second semiconductor region 7 is at least a portion of a p-type semiconductor substrate. That is, the chip 2 includes the first semiconductor region 6 included in the epitaxial semiconductor layer and the second semiconductor region 7 included in the semiconductor substrate. In other words, the chip 2 has a laminated structure including the semiconductor substrate and the epitaxial semiconductor layer located on the semiconductor substrate.

The semiconductor device 1A includes a plurality of device regions 8 partitioned on the first main surface 3. In the semiconductor device 1A, the number and arrangement of the device regions 8 are appropriately determined. Each of the plurality of device regions 8 includes a functional device formed using inside and outside regions of the chip 2. The functional device includes at least one selected from the group of, for example, a semiconductor switching device, a semiconductor rectifying device, and a passive device. The functional device may include a circuit network in which at least two selected from the group of the semiconductor switching device, the semiconductor rectifying device, and the passive device are combined.

The semiconductor switching device includes at least one selected from the group of, for example, a MISFET (Metal Insulator Semiconductor Field Effect Transistor), a BJT (Bipolar Junction Transistor), an IGBT (Insulated Gate Bipolar Junction Transistor), and a JFET. The semiconductor rectifying device may include at least one selected from the group of a pn junction diode, a pin junction diode, a Zener diode, a Schottky barrier diode, and a fast recovery diode. The passive device may include at least one selected from the group of a resistor, a capacitor, an inductor, and a fuse.

The plurality of device regions 8 include at least one transistor region 9. The transistor region 9 includes a FET structure 10 (transistor structure). In the first embodiment, the FET structure 10 has a so-called LDMISFET (Lateral Double Diffused MISFET) structure. The FET structure 10 is, for example, a high-breakdown voltage device to which a drain voltage of 800 V or more may be applied in an off state. The structure of the transistor region 9 will be described below.

As shown in FIGS. 2 and 3, the semiconductor device 1A includes a p-type separation region 11, which is an example of a region separation structure. The separation region 11 is a region at the first main surface 3 that partitions the transistor region 9. The separation region 11 has an annular shape surrounding a portion of the first main surface 3 in a plan view and partitions the transistor region 9. The separation region 11 electrically separates the transistor region 9 from other regions (device regions 8).

In the first embodiment, the separation region 11 has a substantially rectangular annular shape in a plan view. In a plan view, the transistor region 9 is located inside the separation region 11. As shown in FIG. 3, the separation region 11 extends from the first main surface 3 to the second semiconductor region 7 via the first semiconductor region 6 in the third direction Z. In other words, the separation region 11 is provided at both the first semiconductor region 6 and the second semiconductor region 7. Therefore, the separation region 11 is electrically connected to the second semiconductor region 7. The separation region 11 is fixed at the potential of the second semiconductor region 7 (for example, the back gate potential).

The separation region 11 includes a first separation region 12, a second separation region 13, and a third separation region 14. The first separation region 12 is provided at both the first semiconductor region 6 and the second semiconductor region 7. Therefore, a portion of the first separation region 12 is provided at a boundary between the first semiconductor region 6 and the second semiconductor region 7. The first separation region 12 is spaced apart from both the first main surface 3 and the second main surface 4 and is electrically connected to the second semiconductor region 7. A p-type impurity concentration of the first separation region 12 is higher than a p-type impurity concentration of the second semiconductor region 7. The second separation region 13 is a region provided within the first semiconductor region 6 between the first main surface 3 and the first separation region 12 and is electrically connected to the first separation region 12. A p-type impurity concentration of the second separation region 13 is lower than, for example, the p-type impurity concentration of the first separation region 12. The third separation region 14 is a region that constitutes a portion of the first main surface 3, and is surrounded by the second separation region 13 in a plan view. The third separation region 14 is in contact with the second separation region 13. Therefore, the third separation region 14 is electrically connected to the first separation region 12 via the second separation region 13. A p-type impurity concentration of the third separation region 14 is higher than, for example, the p-type impurity concentration of the second separation region 13.

The transistor region 9 includes an n-type impurity region 15 located within the first semiconductor region 6, an n-type well region 16, and an n-type drain region 17.

In the first embodiment, the impurity region 15 is a portion of the first semiconductor region 6 that is partitioned by the separation region 11. An n-type impurity concentration of the impurity region 15 is equal to, for example, an n-type impurity concentration of the first semiconductor region 6.

The well region 16 and the drain region 17 are each provided above the first semiconductor region 6. The well region 16 surrounds the drain region 17 in a plan view and is in contact with at least a bottom of the drain region 17. As a result, a potential of the well region 16 and a potential of the drain region 17 are fixed at the same potential (drain potential). In a plan view, the drain region 17 is spaced apart from a periphery of the well region 16. In other words, the drain region 17 is located inside the periphery of the well region 16 in a plan view. The drain region 17 constitutes a portion of first main surface 3. An n-type impurity concentration of the well region 16 is higher than the n-type impurity concentration of the impurity region 15. Further, an n-type impurity concentration of the drain region 17 is higher than the n-type impurity concentration of the well region 16.

In the first embodiment, the well region 16 has an oval shape extending along the impurity region 15 in a plan view, but the shape is not limited thereto. The well region 16 may have a circular shape, an elliptical shape, or a polygonal shape (for example, a quadrangular shape) in a plan view. In the first embodiment, the drain region 17 has an oval shape in a plan view like the well region 16, but the shape is not limited thereto. The drain region 17 may have a circular shape, an elliptical shape, or a polygonal shape (for example, a quadrangular shape) in a plan view.

The semiconductor device 1A includes an n-type buried region 18 located inside the chip 2. The buried region 18 is provided at both the first semiconductor region 6 and the second semiconductor region 7. Therefore, a portion of the buried region 18 is provided at the boundary between the first semiconductor region 6 and the second semiconductor region 7. An n-type impurity concentration of the buried region 18 is higher than the n-type impurity concentration of the impurity region 15. The n-type impurity concentration of the buried region 18 may be higher than the n-type impurity concentration of the well region 16. The buried region 18 is provided at a position spaced apart from the well region 16. As a result, a portion of the impurity region 15 is located between the buried region 18 and the well region 16 in the third direction Z. In a plan view, the buried region 18 is provided, for example, inside the periphery of the well region 16. At this time, the buried region 18 does not need to overlap the periphery of the well region 16 in a plan view. An area of the buried region 18 in a plan view may be smaller than an area of the well region 16.

The semiconductor device 1A includes a p-type body region 19 located between the separation region 11 and the well region 16 in a plan view. Like the separation region 11, the body region 19 extends from the first main surface 3 to the second semiconductor region 7 via the first semiconductor region 6 in the third direction Z. In other words, the body region 19 is provided at both the first semiconductor region 6 and the second semiconductor region 7. Therefore, the body region 19 is electrically connected to the second semiconductor region 7 and is fixed at the potential of the second semiconductor region 7 (for example, the back gate potential). In the first embodiment, the body region 19 includes a first body region 20 and a second body region 21.

The first body region 20 is provided at both the first semiconductor region 6 (the impurity region 15) and the second semiconductor region 7. Therefore, a portion of the first body region 20 is provided at the boundary between the first semiconductor region 6 and the second semiconductor region 7. The first body region 20 is spaced apart from both the first main surface 3 and the second main surface 4 and is electrically connected to the second semiconductor region 7. A p-type impurity concentration of the first body region 20 is higher than the p-type impurity concentration of the second semiconductor region 7. The second body region 21 is a region provided within the first semiconductor region 6 between the first main surface 3 and the first body region 20 and is electrically connected to the first body region 20. A p-type impurity concentration of the second body region 21 is lower than, for example, the p-type impurity concentration of the first body region 20.

In the first embodiment, in a plan view, the body region 19 is located inside the separation region 11 and has an oval annular shape surrounding the well region 16 and the drain region 17. In a plan view, the body region 19 is partitioned into a first region 19A, a second region 19B, a third region 19C, and a fourth region 19D. Each of the first region 19A, the second region 19B, the third region 19C, and the fourth region 19D is formed by the first body region 20 and the second body region 21.

Each of the first region 19A and the second region 19B is a strip-shaped portion extending along the second direction Y in a plan view and extends in parallel to each other. The first region 19A and the second region 19B are provided such that the drain region 17 is located between the first region 19A and the second region 19B in the first direction X in a plan view. In the second direction Y, each of a length of the first region 19A and a length of the second region 19B may be equal to or less than a length of the drain region 17.

The third region 19C is a strip-shaped portion that connects one end portion of the first region 19A in the second direction Y and one end portion of the second region 19B in the second direction Y. In the first embodiment, the third region 19C extends in an arc strip shape between the one end portion of the first region 19A and the one end portion of the second region 19B in a plan view, but is not limited thereto. The third region 19C may extend along the first direction X.

The fourth region 19D is a strip-shaped portion that connects the other end portion of the first region 19A in the second direction Y and the other end portion of the second region 19B in the second direction Y. In the first embodiment, the fourth region 19D extends in an arc strip shape between the other end portion of the first region 19A and the other end portion of the second region 19B in a plan view, but is not limited thereto. The fourth region 19D may extend along the first direction X.

The semiconductor device 1A includes a source region 22 provided at the body region 19. In the first embodiment, the semiconductor device 1A includes a plurality of source regions 22, but is not limited thereto. Each of the plurality of source regions 22 is an n-type region and is fixed at a source potential. Specifically, the source potential is applied to each of the plurality of source regions 22 from outside the chip 2. Therefore, the source potential is applied to each of the plurality of source regions 22 independently of the back gate potential. The source potential may be a reference potential, a ground potential, or other potentials. An n-type impurity concentration of the source region 22 is higher than the n-type impurity concentration of the well region 16. The n-type impurity concentration of the source region 22 may be equal to the n-type impurity concentration of the drain region 17.

Each of the plurality of source regions 22 has a strip shape in a plan view and is located within the body region 19 and inside a periphery of the body region 19. Further, each of the plurality of source regions 22 constitutes a portion of the first main surface 3, that is, a portion of a surface layer of the body region 19. A portion of the plurality of source regions 22 is located within the first region 19A. Each end portion of the portion in the second direction Y is located at an inner side than each end portion of the first region 19A in the second direction Y, but is not limited thereto. The other portion of the plurality of source regions 22 is located within the second region 19B. Each end portion of the other portion in the second direction Y is located at an inner side than each end portion of the second region 19B in the second direction Y, but is not limited thereto. In the first embodiment, none of the plurality of source regions 22 are located in the third region 19C and the fourth region 19D, but are not limited thereto. In the second direction Y, a length of each source region 22 is equal to or less than, for example, the length of the drain region 17.

When one source region 22 is located at the body region 19, the source region 22 is located in at least one selected from the group of the first region 19A, the second region 19B, the third region 19C, and the fourth region 19D of the body region 19. When the one source region 22 is located in all of the first region 19A, the second region 19B, the third region 19C, and the fourth region 19D, the source region 22 may have, for example, an oval annular shape surrounding the impurity region 15.

The semiconductor device 1A includes an n-type drift region 23 located between the drain region 17 and the source region 22 and at a surface layer of the impurity region 15. The drift region 23 is located at a region between the drain region 17 and the body region 19 and forms a current path connecting the drain region 17 and the source region 22. The drift region 23 has, for example, an oval annular shape surrounding the drain region 17 in a plan view. In the first embodiment, the drift region 23 includes a first portion (straight line portion) extending in the second direction Y so as to be parallel to the first region 19A and the second region 19B, and a second portion (arc portion) extending in an arc shape so as to be parallel to the third region 19C and the fourth region 19D. The drift region 23 forms a current path in a portion along the first region 19A and the second region 19B, but does not form a current path in a portion along the third region 19C and the fourth region 19D.

A width of the drift region 23 is, for example, 50 μm or more and 200 μm or less. The width of the drift region 23 corresponds to a distance between the drain region 17 and the body region 19 and is substantially constant along an oval annular shape, for example. A width of the arc portion of the drift region 23 may increase from the straight line portion toward an arc central portion. On the other hand, a width of the straight line portion of the drift region 23 may be substantially constant.

The semiconductor device 1A includes a p-type channel region 24 located between the drain region 17 and the source region 22 and at the surface layer of the impurity region 15. The channel region 24 is located between the drift region 23 and the source region 22. Therefore, the drift region 23 is located to be closer to the drain region 17 than the channel region 24 is, and the channel region 24 is located to be closer to the source region 22 than the drift region 23 is. In the channel region 24, conduction and non-conduction of the current path between the drain region 17 and the source region 22 are controlled.

The semiconductor device 1A includes a back gate region 25 located at a surface layer of the first main surface 3. In the first embodiment, the semiconductor device 1A includes a plurality of back gate regions 25, but is not limited thereto. Each of the plurality of back gate regions 25 is a p-type region and is fixed at the back gate potential. In other words, the back gate potential is applied to the plurality of back gate regions 25, independently of the source potential. In the first embodiment, each of the plurality of back gate regions 25 is specifically located in a region different from the source region 22 at the surface layer of the body region 19. A p-type impurity concentration of the back gate region 25 is higher than a p-type impurity concentration of the body region 19.

In the first embodiment, each of the plurality of back gate regions 25 has a strip shape in a plan view and is located within the body region 19 and inside the periphery of the body region 19. Further, each of the plurality of back gate regions 25 constitutes a portion of the first main surface 3, that is, a portion of the surface layer of the body region 19. Each of the plurality of back gate regions 25 is located between the corresponding source region 22 and the periphery of the body region 19 in a plan view. Each of the plurality of back gate regions 25 is spaced apart from the periphery of the body region 19, but is not limited thereto. A portion of the plurality of back gate regions 25 is located within the first region 19A. Each end portion of the portion in the second direction Y is located at an inner side than each end portion of the first region 19A in the second direction Y, but is not limited thereto. The other portion of the plurality of back gate regions 25 is located within the second region 19B. Each end portion of the other portion in the second direction Y is located at an inner side than each end portion of the second region 19B in the second direction Y, but is not limited thereto. In the first embodiment, none of the back gate regions 25 are located in the third region 19C and the fourth region 19D, but are not limited thereto. In the second direction Y, a length of each back gate region 25 is equal to or less than, for example, the length of the drain region 17.

Each of the plurality of back gate regions 25 is located between the corresponding source region 22 and the periphery of the body region 19 in a plan view. Further, each of the plurality of back gate regions 25 is adjacent to the corresponding source region 22 in a plan view. Therefore, the source region 22 fixed at the source potential and the back gate region 25 fixed at the back gate potential coexist at the surface layer of the body region 19.

When one back gate region 25 is located in the body region 19, the back gate region 25 is located in at least one selected from the group of the first region 19A, the second region 19B, the third region 19C, and the fourth region 19D of the body region 19. When the one back gate region 25 is located in all of the first region 19A, the second region 19B, the third region 19C, and the fourth region 19D, the back gate region 25 may have, for example, an oval annular shape surrounding the impurity region 15.

The semiconductor device 1A includes an insulating film 30 that selectively covers the first main surface 3 in the transistor region 9. The insulating film 30 includes silicon oxide. The insulating film 30 is a LOCOS film (Local oxidation of silicon film) formed by selective oxidation of the first main surface 3, a buried oxide film (STI: Shallow Trench Isolation) that fills a shallow trench provided on the first main surface 3, etc. From the viewpoint of preventing warping of the semiconductor device 1A, the insulating film 30 has a thickness of, for example, 100 nm or more and 300 nm or less. The insulating film 30 selectively covers the first main surface 3 so as to expose the separation region 11, the drain region 17, the source region 22, and the back gate region 25. In a plan view, the insulating film 30 covers the drift region 23 while not covering at least a portion of the channel region 24, at least a portion of the separation region 11, at least a portion of the source region 22, and at least a portion of the back gate region 25. Therefore, at least a portion of the channel region 24, at least a portion of the separation region 11, at least a portion of the source region 22, and at least a portion of the back gate region 25 are exposed from the insulating film 30. Further, the insulating film 30 covers a region outside the transistor region 9.

The insulating film 30 includes a portion that covers a region between the drain region 17 and the source region 22 at the first main surface 3. This portion is located over, for example, the drift region 23 in the impurity region 15 and has an oval annular shape surrounding the drain region 17 in a plan view. In addition, the insulating film 30 includes a portion that covers a region between the separation region 11 and the source region 22 at the first main surface 3. This portion is located in a region between the separation region 11 and the body region 19 and has an annular shape surrounding the body region 19.

The semiconductor device 1A includes a gate insulating film 36 that is in contact with the first semiconductor region 6 and is located over the channel region 24. A portion of the gate insulating film 36 overlaps the insulating film 30. A thickness of the gate insulating film 36 is less than the thickness of the insulating film 30 and is, for example, 10 nm or more and 200 nm or less. The gate insulating film 36 has a single layer structure or a laminated structure and includes, for example, a silicon oxide film. In the first embodiment, the gate insulating film 36 has an oval annular shape surrounding the insulating film 30 in a plan view. The gate insulating film 36 covers a portion of the drift region 23 and a portion of the body region 19. In the first embodiment, the gate insulating film 36 covers a portion of the second body region 21 and a portion of the source region 22.

The semiconductor device 1A includes a gate electrode 37 located over the gate insulating film 36. The gate electrode 37 includes, for example, a metal film, an alloy film, conductive polysilicon, or the like. When the gate electrode 37 includes conductive polysilicon, the conductive polysilicon includes at least one selected from the group of an n-type region and a p-type region. The gate electrode 37 overlaps not only the channel region 24 but also the drift region 23 in the third direction Z. The gate electrode 37 has an oval annular shape extending along the channel region 24 in a plan view, but is not limited thereto. The gate electrode 37 includes a lead-out portion 38 led out from above the gate insulating film 36 onto the insulating film 30. The lead-out portion 38, in a plan view, has an oval annular shape surrounding a field electrode 31, which will be described later. Further, the entire gate electrode 37, in a plan view, is located at an outer side than the field electrode 31, which will be described later.

The gate electrode 37 includes an inner edge portion 37*a* and an outer edge portion 37*b*. The inner edge portion 37*a* is formed by the lead-out portion 38. The outer edge portion 37*b* is located at a region overlapping the body region 19 in a plan view. In the first embodiment, a width of the gate electrode 37 is non-uniform along the circumferential direction, but is not limited thereto. Specifically, the gate electrode 37 includes a gate extending portion 37*c* extending toward the drain region 17 at the outer edge portion 37*b* (the lead-out portion 38). The gate extending portion 37*c* is a portion provided according to the shape of the field electrode 31 which will be described later. By providing the gate extending portion 37*c*, a distance between the gate electrode 37 and the field electrode 31 is maintained substantially constant in a plan view.

The semiconductor device 1A includes an insulating layer 40 covering the plurality of device regions 8 on the first main surface 3. The insulating layer 40 has a laminated structure including a plurality of interlayer insulating films 41 laminated on each other. The number of layers of the plurality of interlayer insulating films 41 is arbitrary and is not limited to a specific value. The insulating layer 40 may include three or more interlayer insulating films 41. Among the plurality of interlayer insulating films 41, a first interlayer insulating film 41A, a second interlayer insulating film 41B, and a third interlayer insulating film 41C are shown in FIG. 3.

The first interlayer insulating film 41A, the second interlayer insulating film 41B, and the third interlayer insulating film 41C are laminated sequentially in the third direction Z. The first interlayer insulating film 41A covers the first main surface 3, the insulating film 30, the gate insulating film 36, and the gate electrode 37. A thickness of the first interlayer insulating film 41A is determined according to the function required for the field electrode 31, which will be described later, and the thickness of the insulating film 30. In the first embodiment, the thickness of the first interlayer insulating film 41A is 200 nm or more and 800 nm or less. The second interlayer insulating film 41B covers the first interlayer insulating film 41A, and the third interlayer insulating film 41C covers the second interlayer insulating film 41B. Each of the first interlayer insulating film 41A, the second interlayer insulating film 41B, and the third interlayer insulating film 41C includes at least one selected from the group of a silicon oxide film and a silicon nitride film. Therefore, each of the first interlayer insulating film 41A, the second interlayer insulating film 41B, and the third interlayer insulating film 41C may have a single layer structure or a laminated layer structure.

As shown in FIG. 3, the semiconductor device 1A includes the field electrode 31 (field plate) located over the first interlayer insulating film 41A in the transistor region 9. The field electrode 31 has a function of suppressing disturbance of an electric field in the first semiconductor region 6, etc., a function of suppressing local concentration of the electric field, a function of monitoring a high drain-gate voltage Vdg, and the like, and is a high resistance film connected to the drain region 17 and the back gate region 25. The field electrode 31 overlaps the drift region 23 and a portion of the insulating film 30 located over the drift region 23 in the third direction Z. In the first embodiment, the field electrode 31 does not overlap the channel region 24 in the third direction Z. The field electrode 31 includes, for example, polysilicon. The field electrode 31 is not electrically connected to the source region 22. The field electrode 31 forms a potential gradient pointing from the drain region 17 toward the back gate region 25. By providing such a field electrode 31, a bias in electric field distribution in the drift region 23 is suppressed. A thickness of the field electrode 31 is, for example, 50 nm or more and 100 nm or less.

The field electrode 31 is led around in a line shape on the first interlayer insulating film 41A. When a straight line connecting the drain region 17 and the back gate region 25 is set in a plan view, the field electrode 31 extends to cross the straight line multiple times. For example, the field electrode 31 surrounds the drain region 17 concentrically multiple times in a plan view. In the first embodiment, the field electrode 31 has a spiral shape surrounding the drain region 17 in a plan view.

The field electrode 31 includes a first end portion 32 located near the drain region 17, a second end portion 33 located near the body region 19, and a spiral portion 34 extending between the first end portion 32 and the second end portion 33. The arrangement of the first end portion 32 and the second end portion 33 is arbitrary.

The first end portion 32 is a connection portion that is electrically connected to the drain region 17, and is an innermost portion (innermost peripheral portion) of the field electrode 31. A potential applied to the first end portion 32 is at or near the drain potential. The first end portion 32 overlaps the well region 16 in the third direction Z, but is not limited thereto. The second end portion 33 is a connection portion that is electrically connected to the back gate region 25, and is an outermost portion (outermost peripheral portion) of the field electrode 31. A potential applied to the second end portion 33 is at or near the back gate potential. The second end portion 33 overlaps the drift region 23 in the third direction Z, but is not limited thereto. The spiral portion 34 is a portion (connection portion) connecting the first end portion 32 and the second end portion 33, and is wound in an oval spiral shape from the first end portion 32 toward the second end portion 33 so as to surround the drain region 17 in a plan view. The spiral portion 34 overlaps the drift region 23 in the third direction Z. A portion of the spiral portion 34 may overlap the well region 16.

The field electrode 31 forms a potential gradient in a spiral direction from the first end portion 32 to the second end portion 33. Further, the field electrode 31 forms a potential gradient that gradually decreases in accordance with a winding pitch of the spiral portion 34 from the drain region 17 toward the back gate region 25 in a direction perpendicular to the spiral direction. The field electrode 31 thins out the electric field in the drift region 23 and suppresses the bias of the electric field distribution in the drift region 23.

The field electrode 31 may have a line width of 1 μm or more and 5 μm or less. The line width is defined by a width in a direction perpendicular to an extension direction (that is, the spiral direction) of the field electrode 31. The field electrode 31 may have a resistance value of 10 MΩ or more and 100 MΩ or less. The field electrode 31 may be formed with a substantially constant line width in a straight line portion and an arc portion. Further, when a width of the drift region 23 gradually increases toward the arc central portion, the line width of the field electrode 31 may gradually increase from the straight line portion toward the arc central portion.

A pitch of the field electrodes 31 may be 1 μm or more and 10 μm or less. The pitch of the field electrodes 31 is defined by a distance between adjacent line portions (that is, the winding pitch of the spiral portion 34). The number of turns of the field electrode 31 may be 5 or more and 100 or less, or 25 or more and 75 or less.

The semiconductor device 1A includes an inner field electrode 35 located over the first interlayer insulating film 41A and connected to the field electrode 31. The inner field electrode 35 is located to be closer to the drain region 17 than the field electrode 31 is, in a plan view. In the first embodiment, the inner field electrode 35 is located in a region surrounded by the field electrode 31 in a plan view. A potential of the inner field electrode 35 is fixed at the drain potential. The inner field electrode 35 may be a portion of the field electrode 31. In this case, the inner field electrode 35 functions as the innermost peripheral portion of the field electrode 31. The inner field electrode 35 includes, for example, the same material as the field electrode 31 (that is, conductive polysilicon).

The inner field electrode 35 is arranged at a position spaced apart from the drain region 17 in a plan view. In the first embodiment, the inner field electrode 35 has an oval annular shape surrounding the drain region 17. The inner field electrode 35 overlaps the well region 16 in the third direction Z. The inner field electrode 35 includes an inner edge portion 35*a* and an outer edge portion 35*b*. The inner edge portion 35*a* is provided, for example, at a position spaced apart from the drain region 17 by a substantially constant distance in a plan view. The outer edge portion 35*b* is provided, for example, at a position spaced apart from the spiral portion 34 of the field electrode 31 by a substantially constant distance. A distance between the inner field electrode 35 and the spiral portion 34 is equal to, for example, the pitch of the field electrode 31.

In the first embodiment, a width of the inner field electrode 35 is non-uniform along a circumferential direction. The inner field electrode 35 includes an extending portion 35*c* at the outer edge portion 35*b*. The extending portion 35*c* extends toward the field electrode 31 so as to contact the first end portion 32 of the field electrode 31. From the viewpoint of suppressing the bias of the electric field caused by the first end portion 32 of the field electrode 31, the extending portion 35*c* maintains a substantially constant distance between the inner field electrode 35 and the field electrode 31. The extending portion 35*c* is connected to the first end portion 32, but is not limited thereto. In other words, the inner field electrode 35 does not need to be connected to the first end portion 32 as long as it is fixed at the same potential as the first end portion 32. Therefore, the extending portion 35*c* may face a tip of the first end portion 32 in the spiral direction. Note that the presence or absence of the inner field electrode 35 is optional. Therefore, the inner field electrode 35 may not be provided if necessary.

The width of the inner field electrode 35 is, for example, 1 μm or more and 15 μm or less. The inner field electrode 35 may be formed to be wider than the field electrode 31. In this case, the width of the inner field electrode 35 is, for example, 1.5 times or more and 5 times or less the width of the field electrode 31. Note that the width of the inner field electrode 35 may be equal to or less than the line width of the field electrode 31.

The semiconductor device 1A includes a drain wiring 42 that is electrically connected to the drain region 17 and the first end portion 32 of the field electrode 31. The drain wiring 42 is selectively led around within the insulating layer 40. The drain wiring 42 applies the drain potential to the drain region 17 and the first end portion 32 of the field electrode 31. The drain wiring 42 forms, for example, a multilayer wiring within the insulating layer 40.

In the first embodiment, the drain wiring 42 includes a first drain wiring 43, a second drain wiring 44, first drain via electrodes 45A and 45B, and a second drain via electrode 46.

The first drain wiring 43 overlaps the drain region 17, the first end portion 32 of the field electrode 31, and the inner field electrode 35 in the third direction Z, and is located over the second interlayer insulating film 41B. The first drain wiring 43 may overlap the entire drain region 17, the entire region of the first end portion 32, and the entire region of the inner field electrode 35 in the third direction Z. The first drain wiring 43 includes a first portion 43A overlapping the drain region 17 in the third direction Z, and a second portion 43B overlapping the first end portion 32 of the field electrode 31 in the third direction Z. The first portion 43A and the second portion 43B may be spaced apart from each other as long as they are fixed at the same potential.

The second drain wiring 44 overlaps the first drain wiring 43 in the third direction Z and is located over the third interlayer insulating film 41C. In the third direction Z, the second drain wiring 44 may overlap the inner field electrode 35, the first end portion 32 of the field electrode 31, and the spiral portion 34 of the field electrode 31. A thickness of the second drain wiring 44 may be larger than a thickness of the first drain wiring 43.

The first drain via electrode 45A is located between the drain region 17 and the first drain wiring 43 in the third direction Z and connects the drain region 17 and the first drain wiring 43. The first drain via electrode 45A is buried in an opening provided at the second interlayer insulating film 41B. Further, the first drain via electrode 45B is located between the first end portion 32 of the field electrode 31 and the first drain wiring 43 in the third direction Z and connects the first end portion 32 and the first drain wiring 43. The first drain via electrode 45B is buried in an opening provided at the first interlayer insulating film 41A and the second interlayer insulating film 41B. The first drain via electrode 45A may be located between the inner field electrode 35 and the first drain wiring 43 in the third direction Z and may electrically connect the inner field electrode 35 to the first drain wiring 43. The second drain via electrode 46 is located between the first drain wiring 43 and the second drain wiring 44 in the third direction Z and connects the first drain wiring 43 and the second drain wiring 44.

The semiconductor device 1A includes a source wiring 47 electrically connected to the source region 22. The source wiring 47 is selectively led around within the insulating layer 40. The source wiring 47 is electrically insulated from the drain wiring 42 and the back gate region 25. The source wiring 47 applies the source potential to the source region 22. The source wiring 47 forms a multilayer wiring within the insulating layer 40.

The source wiring 47 includes a first source wiring 48, a second source wiring 49, a first source via electrode 50, and a second source via electrode 51. The first source wiring 48 overlaps the source region 22 in the third direction Z and is located over the second interlayer insulating film 41B. The first source wiring 48 may overlap the entire source region 22 in the third direction Z. The first source wiring 48 may not overlap the back gate region 25 in the third direction Z.

The second source wiring 49 is arranged over the second interlayer insulating film 41B so as to face the first source wiring 48 in the third direction Z. The second source wiring 49 may overlap the entire source region 22 in the third direction Z. The second source wiring 49 may overlap the gate electrode 37 and the second end portion 33 of the field electrode 31 in the third direction Z. The second source wiring 49 may overlap a portion of the spiral portion 34 of the field electrode 31 in the third direction Z. A thickness of the second source wiring 49 may be equal to or larger than a thickness of the first source wiring 48.

The first source via electrode 50 is located between the source region 22 and the first source wiring 48 in the third direction Z and is connected to the source region 22 and the first source wiring 48. The second source via electrode 51 is located between the first source wiring 48 and the second source wiring 49 in the third direction Z and is connected to the first source wiring 48 and the second source wiring 49.

The semiconductor device 1A includes a back gate wiring 52 electrically connected to the back gate region 25 and the second end portion 33 of the field electrode 31. The back gate wiring 52 is selectively led around within the insulating layer 40. The back gate wiring 52 is electrically insulated from the source wiring 47. In the first embodiment, the back gate wiring 52 is also electrically connected to the separation region 11. The back gate wiring 52 forms a multilayer wiring within the insulating layer 40.

The back gate wiring 52 includes a first back gate wiring 53, a second back gate wiring 54, first back gate via electrodes 55A to 55C, and a second back gate via electrode 56. The first back gate wiring 53 integrally includes a first portion 53A that overlaps the back gate region 25 in the third direction Z, a second portion 53B that overlaps the second end portion 33 in the third direction Z, and a third portion 53C that overlaps the separation region 11 in the third direction Z. The first portion 53A, the second portion 53B, and the third portion 53C may be spaced apart from each other as long as they are fixed at the same potential.

The first back gate wiring 53 is spaced apart from the source region 22 and is located over the second interlayer insulating film 41B. The first back gate wiring 53 overlaps the back gate region 25, the second end portion 33 of the field electrode 31, and the separation region 11 in the third direction Z. The first back gate wiring 53 may overlap the entire back gate region 25 in the third direction Z. The first back gate wiring 53 may overlap a portion of the spiral portion 34 of the field electrode 31. The first back gate wiring 53 may be led out to a region outside the transistor region 9 in a plan view.

In the first embodiment, the second back gate wiring 54 is located over the second interlayer insulating film 41B. The second back gate wiring 54 overlaps the first back gate wiring 53 in a region outside the transistor region 9. The second back gate wiring 54 may overlap the first back gate wiring 53 within the transistor region 9. A thickness of the second back gate wiring 54 may be equal to or larger than a thickness of the first back gate wiring 53.

The first back gate via electrode 55A is located between the back gate region 25 and the first back gate wiring 53 in the third direction Z and is connected to the back gate region 25 and the first back gate wiring 53. The first back gate via electrode 55B is located between the second end portion 33 of the field electrode 31 and the first back gate wiring 53 in the third direction Z and is connected to the second end portion 33 and the first back gate wiring 53. The first back gate via electrode 55C is located between the separation region 11 and the first back gate wiring 53 in the third direction Z and is connected to the separation region 11 and the first back gate wiring 53. Each of the first back gate via electrodes 55A and 55C is buried in openings provided in the first interlayer insulating film 41A and the second interlayer insulating film 41B. The first back gate via electrode 55B is buried in an opening provided in the second interlayer insulating film 41B.

The second back gate via electrode 56 is located between the first back gate wiring 53 and the second back gate wiring 54 in the third direction Z and is connected to the first back gate wiring 53 and the second back gate wiring 54. The second back gate via electrode 56 is buried in an opening provided in the third interlayer insulating film 41C.

The semiconductor device 1A includes a gate wiring 57 selectively led around within the insulating layer 40 so as to be electrically connected to the gate electrode 37. The gate wiring 57 applies the gate potential to the gate electrode 37. The gate wiring 57 is spaced apart from the drain wiring 42, the source wiring 47, and the back gate wiring 52. The gate wiring 57 forms a multilayer wiring within the insulating layer 40.

The gate wiring 57 includes a first gate wiring 58, a second gate wiring (not shown), a first gate via electrode 59, and a second gate via electrode (not shown). The first gate wiring 58 overlaps the gate electrode 37 in the third direction Z and is located over the second interlayer insulating film 41B. The first gate wiring 58 is led out to a region outside the transistor region 9 in a plan view. In the first embodiment, the second gate wiring (not shown) is located over the second interlayer insulating film 41B and overlaps the first gate wiring 58 in a region outside the transistor region 9 in the third direction Z. A thickness of the second gate wiring may be equal to or larger than a thickness of the first gate wiring 58.

The first gate via electrode 59 is located between the gate electrode 37 and the first gate wiring 58 in the third direction Z and is connected to the gate electrode 37 and the first gate wiring 58. The second gate via electrode (not shown) is located between the first gate wiring 58 and the second gate wiring in the third direction Z and is connected to the first gate wiring 58 and the second gate wiring.

Figure 4:
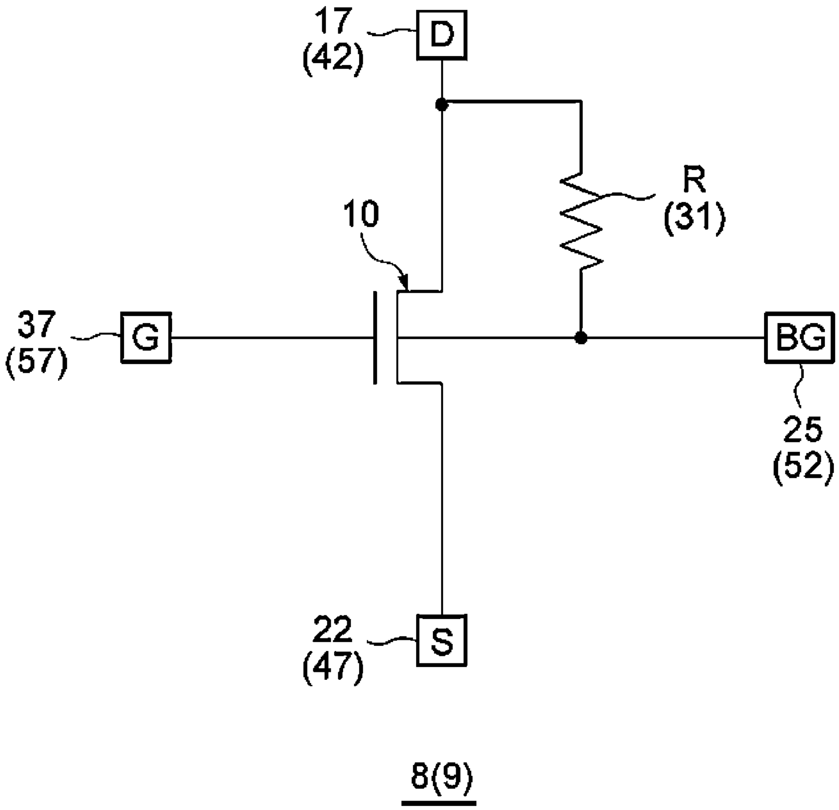
FIG. 4 is a circuit diagram showing an electrical structure within a transistor region.

FIG. 4 is a circuit diagram showing the electrical structure (specifically, the FET structure 10 and the field electrode 31) within the transistor region 9. As shown in FIG. 4, the semiconductor device 1A includes the FET structure 10 and a resistor R in the transistor region 9. A drain D corresponding to the drain region 17, a source S corresponding to the source region 22, a back gate BG corresponding to the back gate region 25, and a gate G corresponding to the gate insulating film 36 and the gate electrode 37 are shown in FIG. 4.

The resistor R corresponds to the field electrode 31 and is electrically connected to the drain D and the back gate BG. On the other hand, the resistor R is not connected to the gate G and the source S. In the first embodiment, only the FET structure 10 and the resistor R are formed in the transistor region 9. That is, no other functional device connected between the drain D and the source S is formed within the transistor region 9. Further, no other functional device connected between the drain D and the gate G is formed within the transistor region 9. Further, no other functional device connected between the source S and the gate G is formed within the transistor region 9.

In the FET structure 10, for example, a drain potential, a source potential, a back gate potential, and a gate potential are applied from a region outside the transistor region 9 (including a region outside the semiconductor device 1A) to the drain D, the source S, the back gate BG, and the gate G, respectively. That is, the FET structure 10 is configured such that the source potential is individually applied to the source S and the back gate potential is individually applied to the back gate BG.

The drain potential may be a power supply potential. The source potential is equal to or lower than the drain potential. The source potential may be a reference potential, a ground potential, or other potentials. The back gate potential is equal to or lower than the drain potential. The back gate potential may be a reference potential, a ground potential, or other potentials. This does not prevent the back gate potential from becoming the same potential as the source potential. That is, while the back gate region 25 is electrically separated from the source region 22 inside the chip 2, the back gate region 25 may be fixed at the same potential as the source region 22 by potential control from the outside.

Next, a method of manufacturing a main part of the semiconductor device 1A according to the first embodiment will be described with reference to FIGS. 5A to 5H. Each of FIGS. 5A to 5H is a diagram for explaining the method of manufacturing the main part of the semiconductor device according to the first embodiment. Herein, the main part is the field electrode 31 located over the first semiconductor region 6.

Figure 5A:
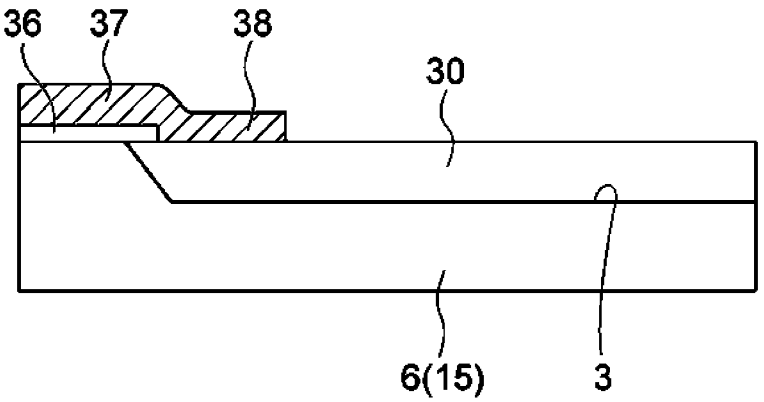
FIG. 5A is a diagram for explaining a method of manufacturing a main part of the semiconductor device according to the first embodiment.

First, as shown in FIG. 5A, the gate electrode 37 including the lead-out portion 38 is formed over the insulating film 30 and the gate insulating film 36 which are provided over the first semiconductor region 6. The gate electrode 37 is provided, for example, by patterning polysilicon formed over the first semiconductor region 6. The polysilicon may be patterned after being silicided.

Note that before forming the gate electrode 37 shown in FIG. 5A, the first semiconductor region 6 (semiconductor layer) including the separation region 11, the drain region 17, the source region 22, the drift region 23, and the channel region 24 is formed over the second semiconductor region 7 included in the semiconductor substrate (that is, over the semiconductor substrate) by a known method. At this time, the first separation region 12, the buried region 18, and the first body region 20 are also formed at the first semiconductor region 6 and the second semiconductor region 7. Subsequently, the insulating film 30 and the gate insulating film 36 in contact with the first semiconductor region 6 are formed sequentially. The insulating film 30 is formed, for example, by forming a groove in a portion of the first semiconductor region 6 and then filling the groove with an insulating material. A portion of the insulating film 30 is formed over the drift region 23 at the first semiconductor region 6 (see FIG. 3). Further, the gate insulating film 36 is formed, for example, by patterning an insulating film formed over the first semiconductor region 6 and the insulating film 30. The gate insulating film 36 is formed over the channel region 24 at the first semiconductor region 6 (see FIG. 3).

Figure 5B:
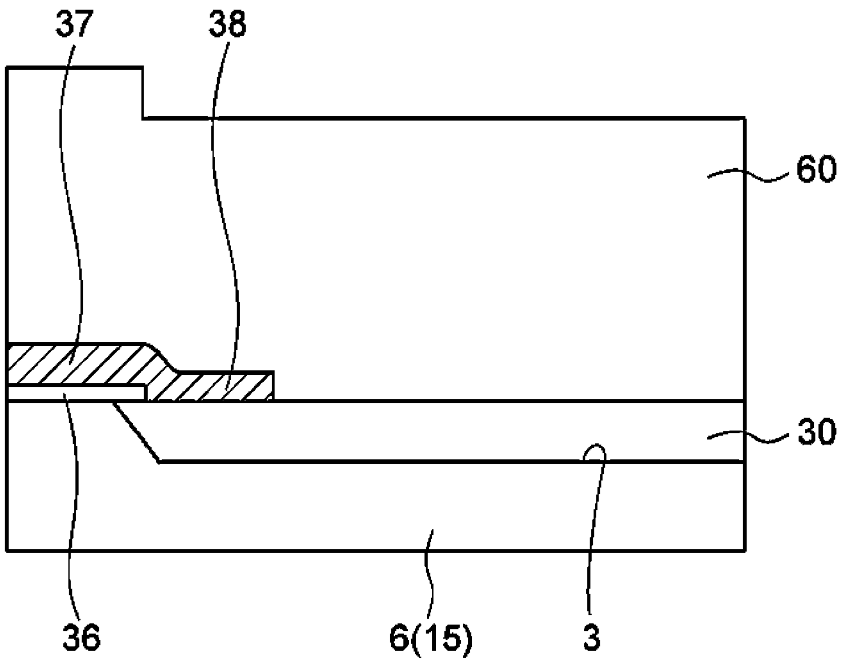
FIG. 5B is a diagram for explaining a method of manufacturing a main part of the semiconductor device according to the first embodiment.

Next, as shown in FIG. 5B, an insulating layer 60 covering the gate electrode 37 is formed. The insulating layer 60 covers not only the gate electrode 37 but also the first semiconductor region 6, the insulating film 30, the gate insulating film 36, etc. For example, the insulating layer 60 is formed by a physical vapor deposition method (PVD method) such as a vacuum evaporation method or a sputtering method, or a chemical vapor deposition method (CVD method).

Figure 5C:
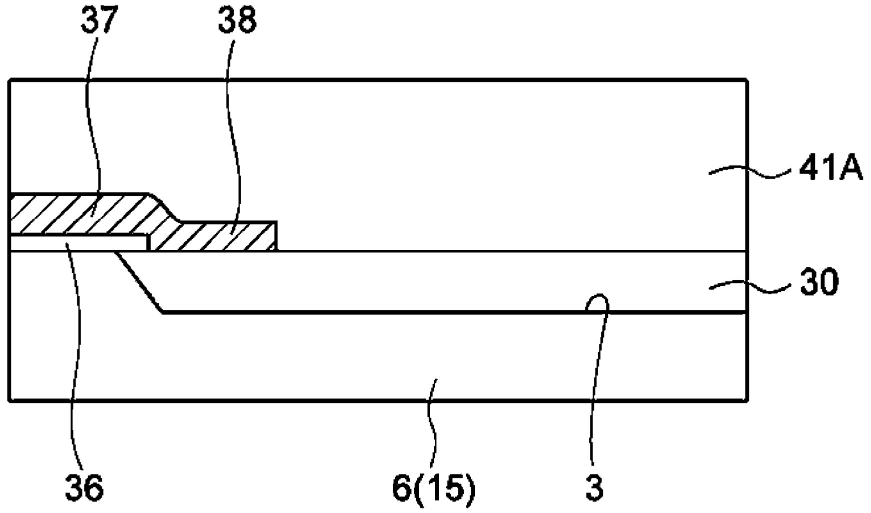
FIG. 5C is a diagram for explaining a method of manufacturing a main part of the semiconductor device according to the first embodiment.

Next, as shown in FIG. 5C, the insulating layer 60 is thinned to form a flattened first interlayer insulating film 41A. For example, the first interlayer insulating film 41A is formed by thinning the insulating layer 60 via chemical mechanical polishing (CMP). Like the insulating layer 60, the first interlayer insulating film 41A covers the gate electrode 37, the first semiconductor region 6, the insulating film 30, the gate insulating film 36, and the like.

Figure 5D:
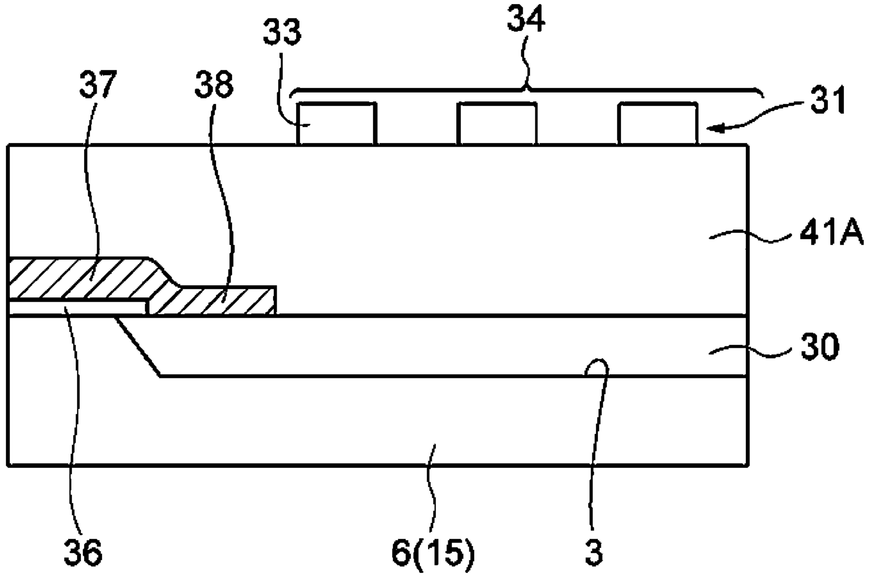
FIG. 5D is a diagram for explaining a method of manufacturing a main part of the semiconductor device according to the first embodiment.

Next, as shown in FIG. 5D, the field electrode 31 is formed over the first interlayer insulating film 41A. For example, the field electrode 31 overlapping the drift region 23 is formed by patterning a polysilicon film formed over the first interlayer insulating film 41A using a mask. Although not shown, the inner field electrode 35 is also formed from the polysilicon film at the same time as the field electrode 31.

Figure 5E:
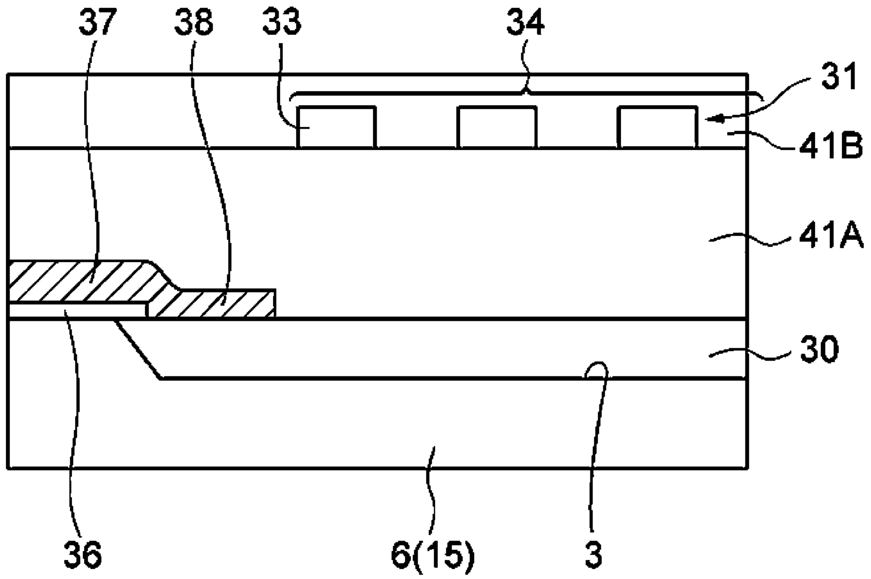
FIG. 5E is a diagram for explaining a method of manufacturing a main part of the semiconductor device according to the first embodiment.

Next, as shown in FIG. 5E, the second interlayer insulating film 41B covering the field electrode 31 is formed over the first interlayer insulating film 41A. For example, the second interlayer insulating film 41B that buries the field electrode 31 is formed by a PVD method or a CVD method.

Figure 5F:
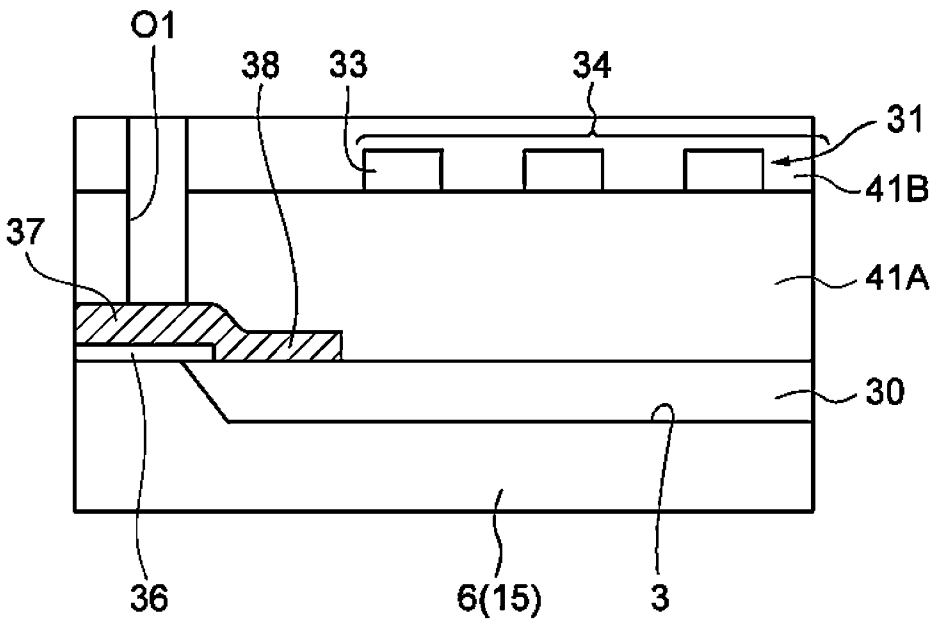
FIG. 5F is a diagram for explaining a method of manufacturing a main part of the semiconductor device according to the first embodiment.

Next, as shown in FIG. 5F, a first opening O1 (contact hole) exposing the gate electrode 37 is formed at the first interlayer insulating film 41A and the second interlayer insulating film 41B. For example, a portion of the first interlayer insulating film 41A and a portion of the second interlayer insulating film 41B are selectively etched using a mask. The etching is anisotropic etching using, for example, dry etching. Although not shown, in the first embodiment, at the same time as the formation of the first opening O1, an opening in which the first drain via electrode 45A is to be provided, an opening in which the first source via electrode 50 is to be provided, an opening in which the first back gate via electrode 55A is to be provided, an opening in which the first back gate via electrode 55C is to be provided, etc. are formed at the first interlayer insulating film 41A and the second interlayer insulating film 41B. As a result, at the same time as the formation of the first opening O1, an opening that exposes the drain region 17, an opening that exposes the source region 22, an opening that exposes the back gate region 25, an opening that exposes the separation region 11, etc. are formed at the first interlayer insulating film 41A and the second interlayer insulating film 41B.

Figure 5G:
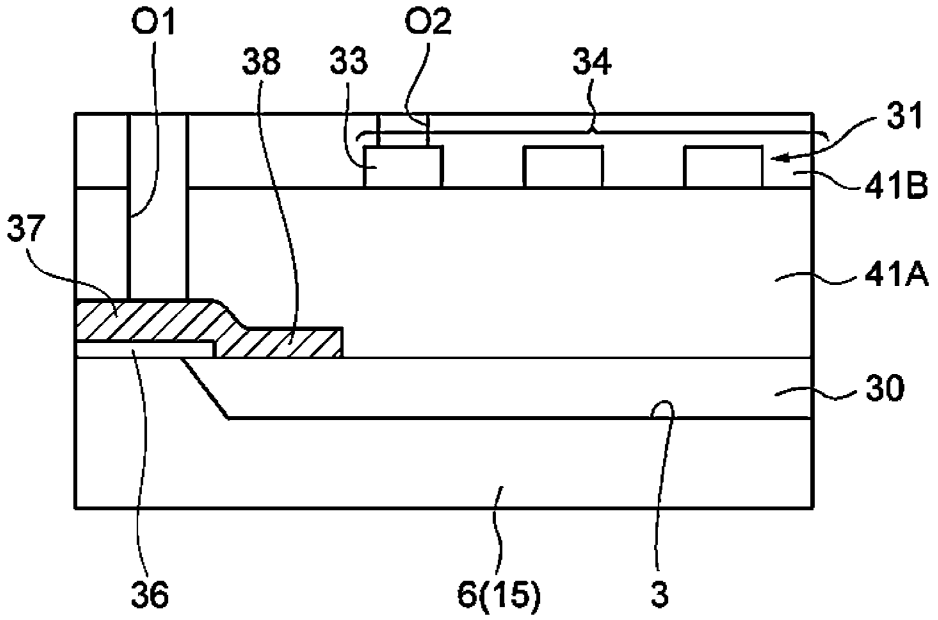
FIG. 5G is a diagram for explaining a method of manufacturing a main part of the semiconductor device according to the first embodiment.

Next, as shown in FIG. 5G, a second opening O2 exposing the field electrode 31 is formed at the second interlayer insulating film 41B. For example, another portion of the second interlayer insulating film 41B is selectively etched by performing anisotropic etching using a mask. As a result, the second opening O2 is formed over the second end portion 33 of the field electrode 31. Although not shown, in the first embodiment, at the same time as the formation of the second opening O2, an opening that overlaps the first end portion 32 of the field electrode 31 and in which the first drain via electrode 45B is to be provided, etc. is formed at the second interlayer insulating film 41B. As a result, at the same time as the formation of the second opening O2, an opening that exposes the first end portion 32, etc. is formed at the second interlayer insulating film 41B.

Figure 5H:
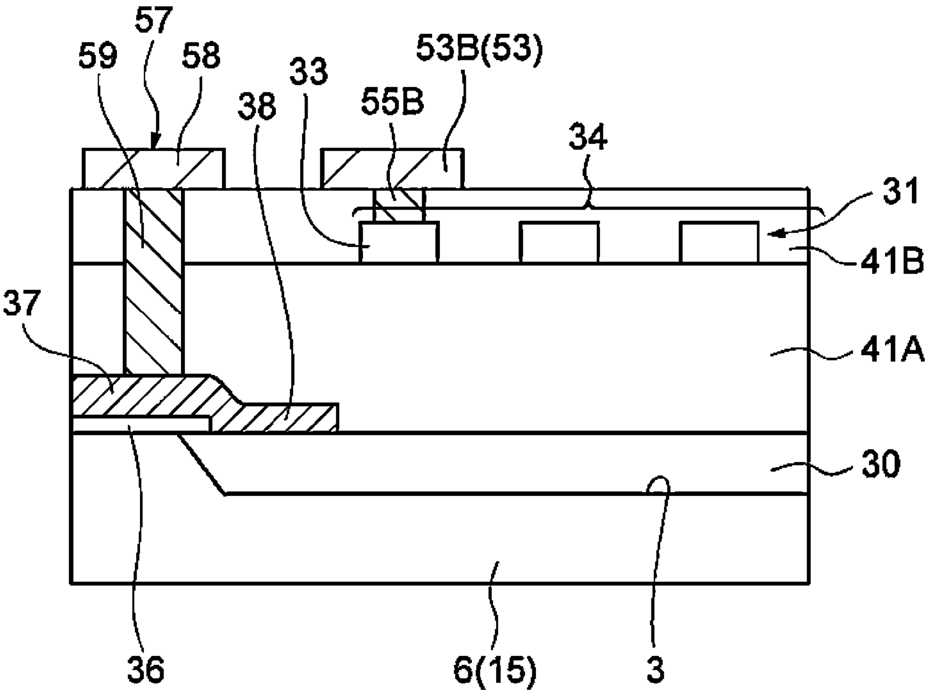
FIG. 5H is a diagram for explaining a method of manufacturing a main part of the semiconductor device according to the first embodiment.

Next, as shown in FIG. 5H, the first gate via electrode 59 (first contact) filled in the first opening O1 and the first back gate via electrode 55B (second contact) filled in the second opening O2 are formed. For example, the first gate via electrode 59 and the first back gate via electrode 55B are formed by patterning a conductive deposit formed by a PVD method. The conductive deposit is buried not only in the first opening O1 and the second opening O2 but also in other openings. Therefore, although not shown, in the first embodiment, at the same time as the formation of the first gate via electrode 59 and the first back gate via electrode 55B, the first drain via electrode 45A, the first drain via electrode 45B, the first source via electrode 50, the first back gate via electrode 55A, the first back gate via electrode 55C, etc. are formed. In addition, the conductive deposit is also deposited over the second interlayer insulating film 41B. Therefore, although not shown, the first drain wiring 43, the first source wiring 48, the first back gate wiring 53, the first gate wiring 58, etc. are also formed at the same time as the first gate via electrode 59 and the first back gate via electrode 55B. From the above, the drain region 17 and the first end portion 32 of the field electrode 31 are electrically connected to each other, and the second end portion 33 of the field electrode 31, the separation region 11, and the back gate region 25 are electrically connected to each other.

Although not shown, after the first gate via electrode 59 and the like are formed, the third interlayer insulating film 41C is formed. Subsequently, after an opening is formed at a portion of the third interlayer insulating film 41C, a conductive deposit is formed when the opening is filled. The conductive deposit is also deposited over the third interlayer insulating film 41C. Subsequently, by patterning the conductive deposit, the second drain via electrode 46, the second drain wiring 44, the second source wiring 49, the second source via electrode 51, the second back gate wiring 54, the second back gate via electrode 56, the second gate wiring, the second gate via electrode, etc. are formed. Through the above steps, the FET structure 10 included in the semiconductor device 1A is formed.

Effects of the semiconductor device 1A according to the first embodiment described above will be described.

For example, when forming a semiconductor device from a 200 mm (approximately 8 inches) silicon wafer, from the viewpoint of resistance to electric field strength, a thickness of an insulating film (for example, a buried insulating film, a LOCOS film, etc.) that is in contact with a semiconductor layer and overlaps a field electrode is set to 500 nm or more (for example, about 700 nm). In this case, for example, when a drain voltage of 800 V is applied to a FET structure, a maximum potential difference of about 100 V is generated between the field electrode and a surface of a semiconductor region directly under the insulating film. As a result, an electric field strength in the insulating film becomes about $1.4\times10^{6}$ V/cm (=about 100 V/700 nm).

Herein, when a semiconductor device is formed from a 300 mm (approximately 12 inches) silicon wafer as in the first embodiment described above and the thickness of the buried insulating film is set to 500 nm, a concern that the silicon wafer may warp arises. In addition, as performance of semiconductor devices improves, wirings, elements, etc. are also miniaturized (for example, minimum active size: 160 nm). In this case, forming a buried insulating film having a thickness of 500 nm is technically difficult since the aspect ratio exceeds 3. Therefore, from the viewpoint of preventing the above-mentioned warping and realizing the manufacturing process of the semiconductor devices, the thickness of the insulating film formed over the silicon wafer is set to be about 250 nm at most. When a field electrode is formed directly above an insulating film having such a thickness, the electric field strength in the insulating film becomes about $3.92\times10^{6}$ V/cm, and there is a great possibility that dielectric breakdown will occur in the insulating film.

In contrast, in the semiconductor device 1A manufactured by the above-described manufacturing method according to the first embodiment, the field electrode 31 is located over the first interlayer insulating film 41A. Thus, in addition to the insulating film 30, the first interlayer insulating film 41A is located between a surface of the first semiconductor region 6 and the field electrode 31. As a result, by the presence of the first interlayer insulating film 41A, the electric field intensity in the insulating film 30 may be relieved. Therefore, in the semiconductor device 1A, even if the insulating film 30 becomes thinner due to the increase in the size of silicon wafers and the miniaturization of wirings, elements, etc., the occurrence of dielectric breakdown between the first semiconductor region 6 and the field electrode 31 may be effectively suppressed. Therefore, according to the first embodiment, it is possible to provide a semiconductor device that can exhibit high reliability even when the wafer size is increased.

In the first embodiment, the first semiconductor region 6 includes the back gate region 25 electrically connected to the field electrode 31. As a result, the electric field distribution between the drain region 17 and the back gate region 25 can be well adjusted.

In the first embodiment, the field electrode 31 includes the first end portion 32 electrically connected to the drain region 17, the second end portion 33 electrically connected to the back gate region 25, and the spiral portion 34 electrically connecting the first end portion 32 and the second end portion 33. As a result, an adequate potential gradient is formed from the first end portion 32 to the second end portion 33.

Figure 6:
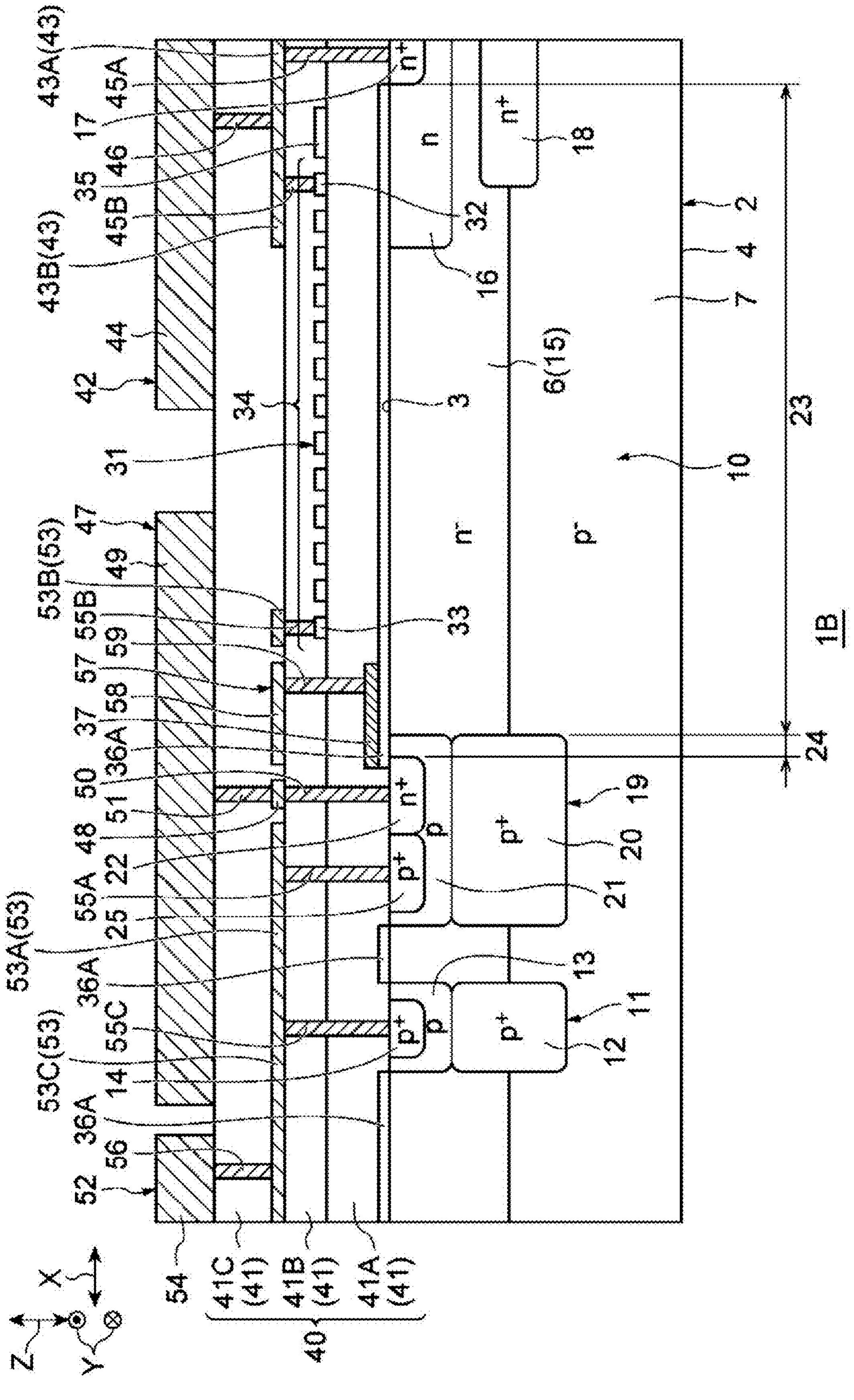
FIG. 6 is a schematic cross-sectional view of a main part of a semiconductor device according to a modification of the first embodiment.

FIG. 6 is a schematic cross-sectional view showing a semiconductor device according to a modification of the first embodiment. As shown in FIG. 6, the semiconductor device 1B is different from the first embodiment in that the insulating film 30 is not formed and an insulating film 36A is formed instead. In other words, in this modification, the first semiconductor region 6 is not provided with a groove. In this modification as well, not only the insulating film 36A but also the first interlayer insulating film 41A is located between the field electrode 31 and the first semiconductor region 6 (that is, the first main surface 3). Therefore, the same effects as in the first embodiment may be achieved in the above modification.

In the above modification, the insulating film 36A is located between the field electrode 31 and the first semiconductor region 6, but the present disclosure is not limited thereto. For example, only the first interlayer insulating film 41A may be located between the field electrode 31 and the first semiconductor region 6. Even in this case, the same effects as in the first embodiment may be achieved by increasing the thickness of the first interlayer insulating film 41A.

Second Embodiment

A second embodiment will be described below with reference to FIGS. 7, 8, and 9A to 9E. In the description of the second embodiment, descriptions that overlap with those of the above-described first embodiment are omitted, and parts containing differences are described. In other words, the descriptions of the first embodiment may be used in the second embodiment as appropriate to the extent technically possible.

Figure 7:
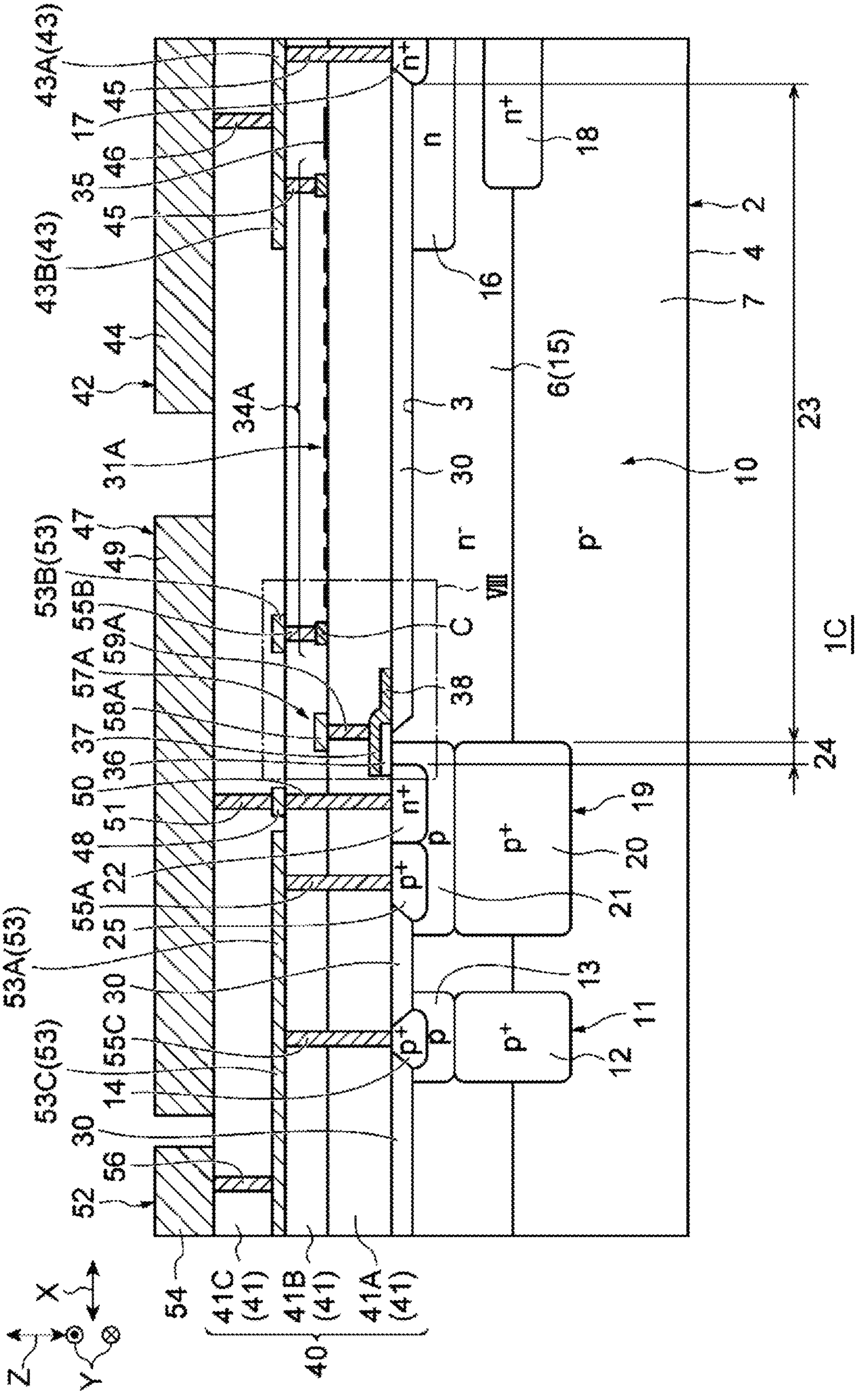
FIG. 7 is a schematic cross-sectional view of a main part of a semiconductor device according to a second embodiment.
Figure 8:
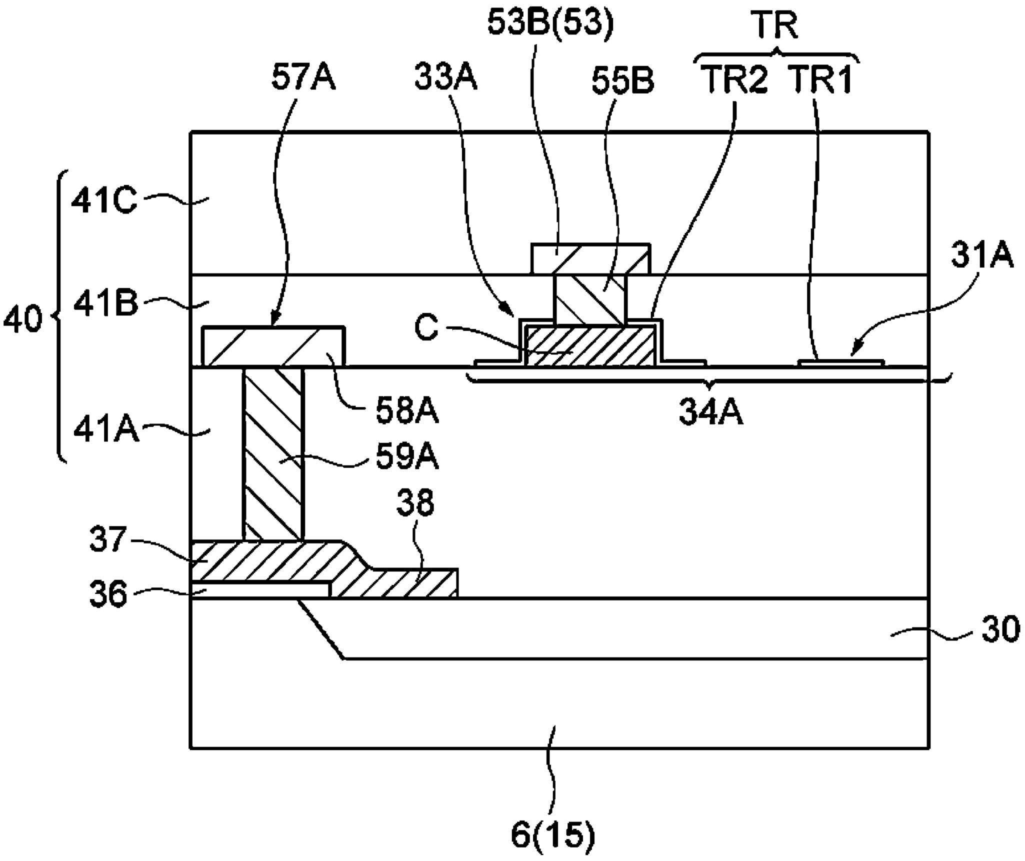
FIG. 8 is a schematic cross-sectional view of region VIII shown in FIG. 7.

FIG. 7 is a schematic cross-sectional view of a main part of a semiconductor device according to the second embodiment. FIG. 8 is a schematic cross-sectional view of region VIII shown in FIG. 7. As shown in FIG. 7, the semiconductor device 1C according to the second embodiment is different from the semiconductor device 1A according to the first embodiment in that a field electrode 31A is provided. Additionally, in the second embodiment, in the semiconductor device 1C, a first gate wiring 58A is located over the first interlayer insulating film 41A.

As shown in FIG. 8, the field electrode 31A is formed from a thin film resistor TR. The thin film resistor TR is a high resistance film containing, for example, chromium silicide, and is significantly thinner than the polysilicon in the first embodiment. In the second embodiment, the thickness of the thin film resistor TR is 1 nm or more and 30 nm or less. The thin film resistor TR includes a main portion TR1 forming a spiral portion 34A, and a covering portion TR2 to be described below. The chromium silicide contains, for example, at least one selected from the group of CrSi, $CrSi_2$, CrSiN, and CrSiO. CrSiN is also chromium nitride. CrSiO is also chromium oxide. In the second embodiment, the chromium silicide is CrSi.

A conductive layer C (first conductive layer) is provided at a second end portion 33A included in the field electrode 31A. The conductive layer C is a conductor formed simultaneously with a gate wiring 57A and the like. At least a portion of the conductive layer C is covered by the covering portion TR2 included in the thin film resistor TR and is in contact with the thin film resistor TR. Therefore, the conductive layer C is electrically connected to the thin film resistor TR. In addition, the conductive layer C is in contact with the first back gate via electrode 55B (second conductive layer). Therefore, the back gate wiring 52 is electrically connected to the field electrode 31A via the conductive layer C. Although not shown, a first end portion included in the field electrode 31A is also provided with a conductive layer covering the thin film resistor TR, similarly to the second end portion 33A.

Next, a method of manufacturing a main part of the semiconductor device 1C according to the second embodiment will be described with reference to FIGS. 9A to 9E. Each of FIGS. 9A to 9E is a diagram for explaining the method of manufacturing the main part of the semiconductor device according to the second embodiment. Herein, the main part is the field electrode 31A.

Figure 9A:
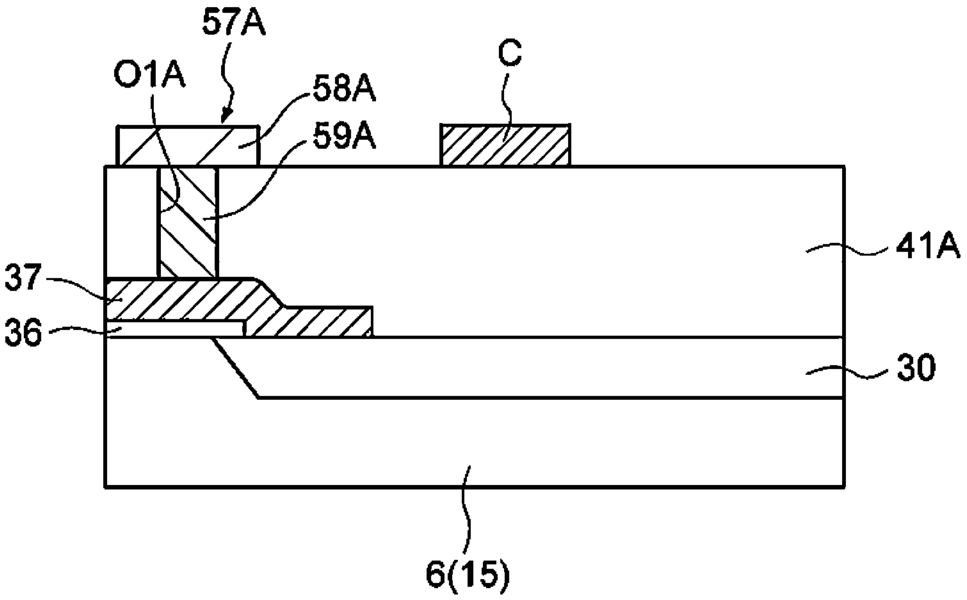
FIG. 9A is a diagram for explaining a method of manufacturing a main part of the semiconductor device according to the second embodiment.

First, as shown in FIG. 9A, the gate wiring 57A including a first gate via electrode 59A filled in a first opening O1A provided in the first interlayer insulating film 41A is formed. Herein, the conductive layer C is formed at the same time as the formation of the gate wiring 57A at a portion where the second end portion 33A of the field electrode 31A is to be provided later. Further, another conductive layer is also formed at a portion where the first end portion of the field electrode 31A is to be provided later.

Before forming the gate wiring 57A and the conductive layer C shown in FIG. 9A, in the same manner as in the above-described first embodiment, the first semiconductor region 6 (semiconductor layer), the insulating film 30, the gate insulating film 36, the gate electrode 37, and the first interlayer insulating film 41A are formed over the second semiconductor region 7 (over the semiconductor substrate). Note that the second embodiment is different from the above-described first embodiment in that the first opening O1A, the gate wiring 57A, the conductive layer C, etc. are formed before the field electrode 31A is formed.

Figure 9B:
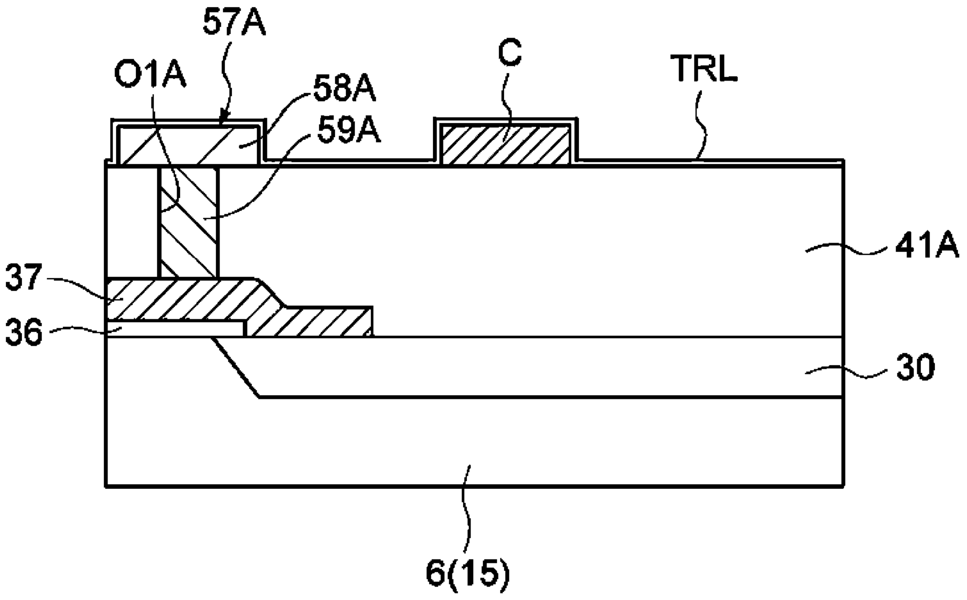
FIG. 9B is a diagram for explaining a method of manufacturing a main part of the semiconductor device according to the second embodiment.

Next, as shown in FIG. 9B, a thin film resistance layer TRL covering the first interlayer insulating film 41A, the conductive layer C, the gate wiring 57A, etc. is formed. For example, the thin film resistance layer TRL containing chromium silicide is formed by a PVD method.

Figure 9C:
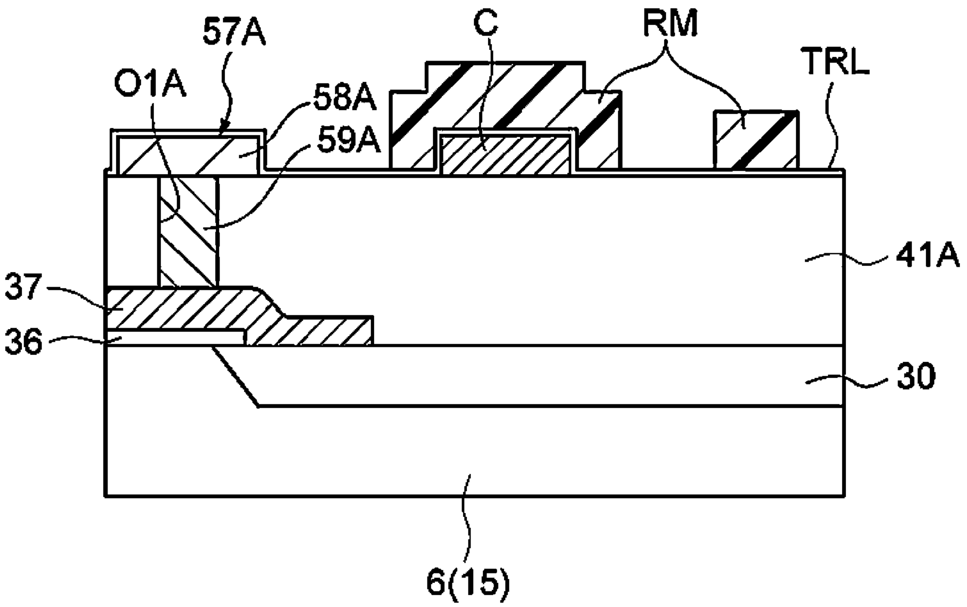
FIG. 9C is a diagram for explaining a method of manufacturing a main part of the semiconductor device according to the second embodiment.

Next, as shown in FIG. 9C, a patterned resist mask RM is formed over the thin film resistance layer TRL. For example, the resist mask RM is formed by photolithography. The resist mask RM may be a negative resist or a positive resist.

Figure 9D:
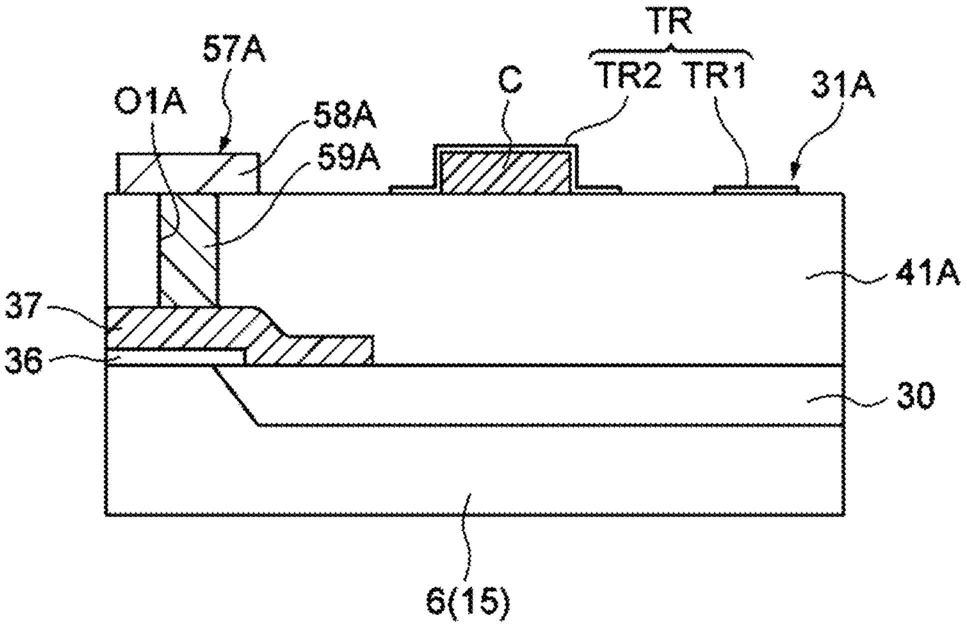
FIG. 9D is a diagram for explaining a method of manufacturing a main part of the semiconductor device according to the second embodiment.

Next, as shown in FIG. 9D, a portion of the thin film resistance layer TRL that is not covered by the resist mask RM is etched. For example, the portion of the thin film resistance layer TRL is etched by wet etching or dry etching. Subsequently, the resist mask RM is removed. For example, the resist mask RM is removed by wet etching. As a result, the field electrode 31A is formed over the first interlayer insulating film 41A. Further, the gate wiring 57A and the like are exposed from the thin film resistance layer TRL.

Figure 9E:
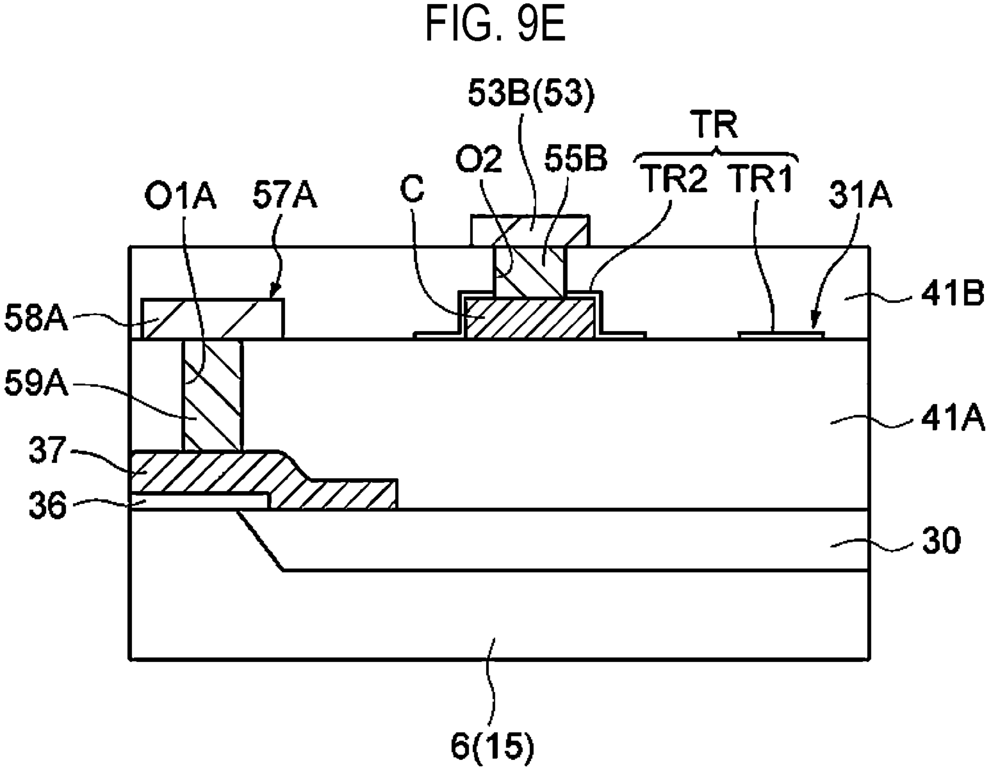
FIG. 9E is a diagram for explaining a method of manufacturing a main part of the semiconductor device according to the second embodiment.

Next, as shown in FIG. 9E, the second interlayer insulating film 41B is formed to cover the first interlayer insulating film 41A, the gate wiring 57A, the field electrode 31A, etc. Subsequently, the second opening O2 is formed at the second interlayer insulating film 41B by etching a portion of the second interlayer insulating film 41B. In the second embodiment, when forming the second opening O2, a portion of the covering portion TR2 of the thin film resistor TR (a portion of the covering portion TR2 that overlaps the second opening O2) is also etched. As a result, a portion of a top surface of the conductive layer C that overlaps the second opening O2 is exposed from the second interlayer insulating film 41B. Although not shown, when forming the second opening O2, a portion of the thin film resistor TR exposed from the second interlayer insulating film 41B (for example, a portion included in the first end portion) is also removed. Subsequently, the back gate wiring 52 including the first back gate via electrode 55B (second contact or second conductive layer) filled in the second opening O2 is formed. Similar to the first embodiment, a corresponding via electrode (first drain via electrode) is formed in the opening formed in the second interlayer insulating film 41B. Then, the third interlayer insulating film 41C and the like are formed using the same method as in the above-described first embodiment, thereby manufacturing the semiconductor device 1C.

The second embodiment described above also provides the same effects as the above-described first embodiment. In addition, since the field electrode 31A includes the thin film resistor TR, it is possible to further increase a breakdown voltage of the semiconductor device 1C and improve accuracy of a resistance value of the field electrode 31A. Further, since it is possible to reduce the number of masks as compared to the first embodiment, cost reduction and yield improvement may also be realized.

As described above, in the second embodiment, when forming the second opening O2, the portion of the covering portion TR2 of the thin film resistor TR is also etched. This allows the conductive layer C to directly contact the first back gate via electrode 55B, thereby reducing contact resistance. Note that when forming the second opening O2, the covering portion TR2 of the thin film resistor TR does not need to be etched. In this case, the covering portion TR2 may function as an etch stopper.

The contents of the modification of the above-described first embodiment may be applied to the second embodiment described above. For example, the insulating film 30 may not be formed in the semiconductor device 1C. In this case, the insulating film 36A may be formed as in the modification of the above-described first embodiment, or only the first interlayer insulating film 41A may be located between the field electrode 31A and the first semiconductor region 6.

Third Embodiment

A third embodiment will be described below with reference to FIG. 10. In the description of the third embodiment, descriptions that overlap with those of the above-described first and second embodiments are omitted, and parts containing differences are described. In other words, the descriptions of the first and second embodiments may be used in the third embodiment as appropriate to the extent technically possible.

Figure 10:
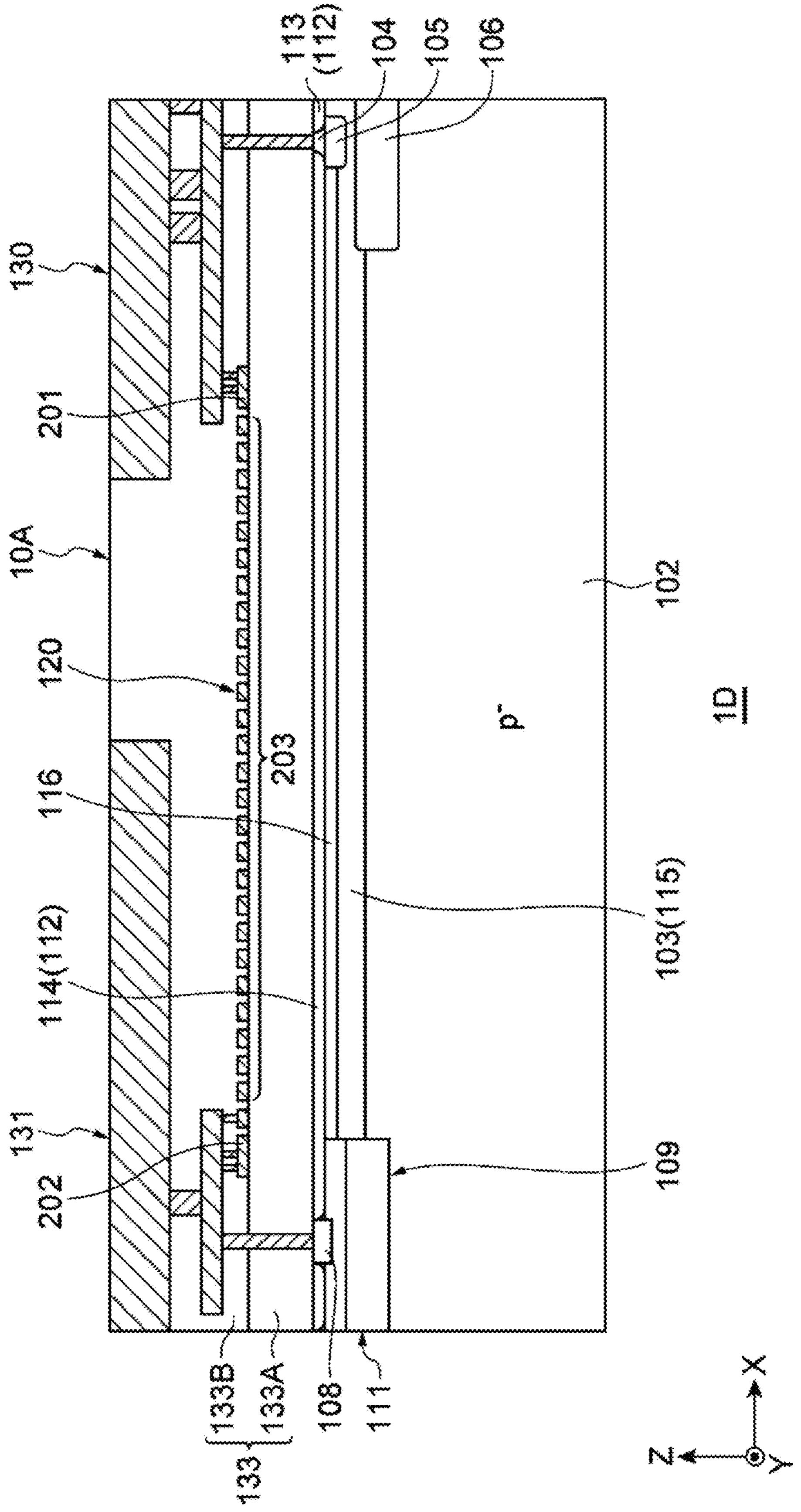
FIG. 10 is a schematic cross-sectional view of a main part of a semiconductor device according to a third embodiment.

FIG. 10 is a schematic cross-sectional view of a main part of a semiconductor device according to the third embodiment. As shown in FIG. 10, a FET structure 10A included in the semiconductor device 1D has a so-called JFET (Junction FET) structure and includes a p-type semiconductor substrate 102 and an n-type semiconductor layer 103 located over the semiconductor substrate 102.

The semiconductor substrate 102 is a high-resistance silicon substrate. The semiconductor layer 103 is an epitaxial semiconductor layer formed over the semiconductor substrate 102. A drain region 104 having a second conductivity type is located within the semiconductor layer 103. The drain region 104 is a region that functions as a drain of the FET structure 10A and has an oval annular shape in a plan view. An n-type drain side well region 105 that is in contact with the drain region 104 is formed below the drain region 104 within the semiconductor layer 103. The drain side well region 105 is a region that covers a bottom and sides of the drain region 104 and has an oval annular shape surrounding the drain region 104 in a plan view. An n-type drain buffer region 106 is formed below the drain side well region 105. The drain buffer region 106 is a region that forms a pn junction with the semiconductor substrate 102 and is located within the semiconductor substrate 102 and within the semiconductor layer 103. By forming the pn junction between the drain buffer region 106 and the semiconductor substrate 102, a breakdown voltage of the semiconductor device 1D is increased. The drain buffer region 106 has an oval shape in a plan view. A periphery of the drain buffer region 106 is located outside an outer periphery of the drain region 104 in a plan view.

A source/gate region 109 is formed at the semiconductor layer 103. Although not shown, at the source/gate region 109, an n-type source region (not shown) and a p-type gate region 108 are electrically connected to each other and alternately arranged at intervals in a plan view. In the third embodiment, the source/gate region 109 has an oval annular shape that is spaced apart from the drain region 104 and located around the drain region 104 in a plan view. The source region is in an electrically floating state and has a square shape in a plan view. The gate region 108 is electrically connected to the ground (GND) and has a square shape in a plan view.

The source/gate region 109 includes an n-type source side well region (not shown) and a p-type gate side well region 111. The source side well region is located within the semiconductor layer 103 and below the source region. The gate side well region 111 is located within the semiconductor substrate 102 and the semiconductor layer 103 and below the gate region 108. The source side well region is a region that is in contact with the source region and covers a bottom and sides of the source region. The gate side well region 111 is a region that is in contact with the gate region 108 and covers a bottom and sides of the gate region 108. A contact portion between the gate side well region 111 and the source side well region forms a pn junction. The gate side well region 111 includes a region located between two adjacent source side well regions, etc.

A current flowing between the drain region 104 and the source region via the semiconductor layer 103 is controlled by applying a predetermined control voltage to the source/gate region 109. More specifically, when the predetermined control voltage is applied to the source region, a depletion layer expands from the pn junction formed by the source side well region and the gate side well region 111. As a result, the source region and the source side well region are depleted. This closes a current path between the drain region 104 and the source region, so that no current flows between the drain region 104 and the source region. On the other hand, when the application of the control voltage to the source region is released, the depletion of the source region and the source side well region is released. This opens the current path between the drain region 104 and the source region, so that a current flows between the drain region 104 and the source region. In this way, in the FET structure 10A, the current flowing between the drain region 104 and the source region is controlled.

A LOCOS film 112 serving as an example of an insulating layer that selectively exposes the drain region 104 and the source/gate region 109 is located over the semiconductor layer 103. The LOCOS film 112 is located between the drain region 104 and the source/gate region 109 in a plan view. A thickness of the LOCOS film 112 is, for example, 5,000 Å or more and 15,000 Å or less. The LOCOS film 112 includes an inner LOCOS film 113 that has an oval shape in a plan view and covers a region surrounded by the drain region 104, and an outer LOCOS film 114 that has an oval annular shape in a plan view and covers a region between the drain region 104 and the source/gate region 109.

In the semiconductor layer 103, a region overlapping the outer LOCOS film 114 corresponds to a drift region 115. A length of the drift region 115 is, for example, 80 μm or more and 200 μm or less. The length of the drift region 115 corresponds to a channel length of the FET structure 10A. Therefore, in the third embodiment, it may be said that a channel region coexists at the drift region 115. A p-type resurf layer 116 is formed at a portion of the semiconductor layer 103 that is in contact with the outer LOCOS film 114. The resurf layer 116 forms a pn junction with the drift region 115 of the semiconductor layer 103. In a plan view, the resurf layer 116 has an oval annular shape that follows a planar shape of the outer LOCOS film 114.

A plurality of interlayer insulating films 133 are provided over the semiconductor layer 103. In the third embodiment, the plurality of interlayer insulating films 133 include a first interlayer insulating film 133A located directly above the LOCOS film 112, and a second interlayer insulating film 133B located over the first interlayer insulating film 133A. The first interlayer insulating film 133A has the same function and configuration as, for example, the first interlayer insulating film 41A of the above-described first embodiment. Each of the first interlayer insulating film 133A and the second interlayer insulating film 133B may have a single layer structure or a laminated structure.

A resistive field electrode 120 is located over the first interlayer insulating film 133A. Therefore, the LOCOS film 112 and the first interlayer insulating film 133A are located between the semiconductor layer 103 and the field electrode 120. The field electrode 120 has the same function and configuration as, for example, the field electrode 31 of the above-described first embodiment. The field electrode 120 is arranged between the drain region 104 and the source/gate region 109 in a plan view. The field electrode 120 includes an innermost peripheral portion 201, an outermost peripheral portion 202, and an intermediate portion 203.

The innermost peripheral portion 201 is a portion electrically connected to the drain region 104 and is closest to the drain region 104 in the field electrode 120. Therefore, in a plan view, no field electrode 120 exists at an inner side of the innermost peripheral portion 201 of the field electrode 120. The outermost peripheral portion 202 is a portion electrically connected to the source/gate region 109 and the ground and is closest to the source/gate region 109 in the field electrode 120. Therefore, no field electrode 120 exists at an outer side of the outermost peripheral portion 202 of the field electrode 120. The intermediate portion 203 is a main portion of the field electrode 120 and is a connecting portion that connects the innermost peripheral portion 201 and the outermost peripheral portion 202. The intermediate portion 203 has a strip shape that extends spirally in a plan view.

A drain metal 130 electrically connected to the drain region 104 and a gate metal 131 electrically connected to the gate region 108 are arranged over the semiconductor layer 103. Although not shown, a source metal electrically connected to the source region is also arranged over the semiconductor layer 103. At least a portion of the drain metal 130, at least a portion of the gate metal 131, and at least a portion of the source metal are selectively formed within the interlayer insulating film 133. The drain metal 130 is electrically connected to the drain region 104 and the innermost peripheral portion 201 of the field electrode 120. The gate metal 131 is electrically connected to the gate region 108 and the outermost peripheral portion 202 of the field electrode 120. Although not shown, the source metal is electrically connected to the source region.

The third embodiment described above also provides the same effects as the above-described first embodiment. That is, even if the structure of the FET is changed, the semiconductor device 1D exhibiting high reliability may be obtained.

The contents of the modification of the above-described first embodiment may be applied to the third embodiment described above. For example, the LOCOS film 112 may not be formed in the semiconductor device 1D. In this case, for example, the insulating film 36A may be formed as in the modification of the above-described first embodiment. Alternatively, the contents of the above-described second embodiment may be applied to the third embodiment.

Although the embodiments and modifications of the present disclosure have been described above, the present disclosure may also be implemented in other forms.

In the above-described embodiments and modifications, a configuration may be adopted in which the conductivity types of various semiconductor regions are reversed. That is, the p-type portion may be made into an n-type, and the n-type portion may be made into a p-type.

In the above-described embodiments and modifications, the semiconductor device may be applied to, for example, power modules used in inverter circuits that drive electric motors used as a power source for a car (including an electric car), a train, an industrial robot, an air conditioner, an air compressor, an electric fan, a vacuum cleaner, a dryer, a refrigerator, etc. Further, the semiconductor device may also be applied to power modules used in inverter circuits of solar cells, wind power generators, and other power generation devices. Alternatively, the semiconductor device may also be applied to circuit modules that constitute an analog control power supply, a digital control power supply, or the like.

The embodiments and modifications according to one aspect of the present disclosure have been described in detail above, but these are only specific examples used to clarify the technical contents of the present disclosure, and the present disclosure should not be construed as limited to these specific examples and the scope of the present disclosure is limited only by the appended claims.

Examples of the features extracted from the description of the present disclosure and drawings are shown below.

[A1] A semiconductor device including:

a semiconductor substrate;

a semiconductor layer that is located over the semiconductor substrate and includes a drain region, a source region, a drift region, and a channel region;

an insulating film that is in contact with the semiconductor layer and is located over the channel region;

a first interlayer insulating film that covers the insulating film; and a field plate that is located over the first interlayer insulating film, overlaps the drift region, and is electrically connected to the drain region.

[A2] The semiconductor device of [A1], further including: a gate electrode that is located over the insulating film, wherein the gate electrode is covered by the first interlayer insulating film.

[A3] The semiconductor device of [A2], wherein each of the gate electrode and the field plate includes polysilicon.

[A4] The semiconductor device of any one of [A1] to [A3], wherein the semiconductor layer further includes a back gate region that is electrically connected to the field plate.

[A5] The semiconductor device of [A4], wherein the field plate includes an innermost peripheral portion that is electrically connected to the drain region, an outermost peripheral portion that is electrically connected to the back gate region, and a connecting portion that connects the innermost peripheral portion and the outermost peripheral portion.

[A6] The semiconductor device of any one of [A1] to [A5], further including: a LOCOS (Local Oxidation of Silicon) film that is in contact with the semiconductor layer, wherein the field plate overlaps the LOCOS film and the first interlayer insulating film.

[A7] The semiconductor device of [A1], wherein the semiconductor layer further includes a source/gate region that is provided with the source region and a gate region electrically connected to the source region, the source/gate region being spaced apart from the drain region and located around the drain region.

[A8] The semiconductor device of [A7], wherein the field plate includes an innermost peripheral portion that is electrically connected to the drain region, an outermost peripheral portion that is electrically connected to a ground, and a connecting portion that connects the innermost peripheral portion and the outermost peripheral portion.

[A9] The semiconductor device of any one of [A1] to [A8], wherein the insulating film is a LOCOS (Local Oxidation of Silicon) film.

[A10] The semiconductor device of any one of [A1] to [A9], wherein the field plate includes polysilicon.

[A11] The semiconductor device of any one of [A1] to [A10], wherein the field plate includes chromium silicide.

[A12] The semiconductor device of [A11], wherein the field plate has a thickness of 1 nm or more and 30 nm or less.

[A13] The semiconductor device of [A11] or [A12], further including:

a first conductive layer that is located over the first interlayer insulating film and is electrically connected to the field plate;

a second interlayer insulating film that covers the first conductive layer and the field plate; and a second conductive layer that is filled in an opening provided at the second interlayer insulating film and is electrically connected to the field plate, wherein the first conductive layer includes an exposed portion exposed from the field plate, and wherein the second conductive layer is in contact with the exposed portion.

[B1] A method of manufacturing a semiconductor device, including:

forming a semiconductor layer, which includes a drain region, a source region, a drift region, and a channel region, over a semiconductor substrate;

forming an insulating film that is in contact with the semiconductor layer and is located over the channel region;

forming a first interlayer insulating film that covers the insulating film;

forming a field plate that is located over the first interlayer insulating film and overlaps the drift region;

forming a second interlayer insulating film that covers the field plate;

forming a first opening in the first interlayer insulating film and the second interlayer insulating film;

forming a second opening, which exposes the field plate, in the second interlayer insulating film; and forming a first contact to be filled in the first opening and a second contact to be filled in the second opening.

[B2] The method of [B1], wherein the field plate includes polysilicon.

[C1] A method of manufacturing a semiconductor device, including:

forming a semiconductor layer, which includes a drain region, a source region, a drift region, and a channel region, over a semiconductor substrate;

forming an insulating film that is in contact with the semiconductor layer and is located over the channel region;

forming a first interlayer insulating film that covers the insulating film;

forming a first opening in the first interlayer insulating film;

forming a contact to be filled in the first opening and a conductive layer located over the first interlayer insulating film;

forming a resistance layer that covers the first interlayer insulating film, the contact, and the conductive layer and includes chromium silicide; and forming a field plate including a covering portion covering the conductive layer by patterning the resistance layer.

[C2] The method of [C1], wherein the field plate has a thickness of 1 nm or more and 30 nm or less.

[C3] The method of [C1] or [C2], further including:

forming a second interlayer insulating film that covers the field plate;

forming a second opening, which exposes the conductive layer, in the second interlayer insulating film by etching a portion of the second interlayer insulating film and the covering portion of the field plate; and forming a second contact to be filled in the second opening.

[C4] The method of any one of [B1], [B2], [C1], [C2], and [C3], further including: forming a gate electrode over the insulating film before forming the first interlayer insulating film.

The above semiconductor device and its manufacturing method may exhibit high reliability even when the wafer size is increased.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:

a semiconductor substrate;

a semiconductor layer that is located over the semiconductor substrate and includes a drain region, a source region, a drift region, and a channel region;

an insulating film that is in contact with the semiconductor layer and is located over the channel region;

a first interlayer insulating film that covers the insulating film; and a field plate that is located over the first interlayer insulating film, overlaps the drift region, and is electrically connected to the drain region.

2. The semiconductor device of claim 1, further comprising: a gate electrode that is located over the insulating film, wherein the gate electrode is covered by the first interlayer insulating film.

3. The semiconductor device of claim 2, wherein each of the gate electrode and the field plate includes polysilicon.

4. The semiconductor device of claim 1, wherein the semiconductor layer further includes a back gate region that is electrically connected to the field plate.

5. The semiconductor device of claim 4, wherein the field plate includes an innermost peripheral portion that is electrically connected to the drain region, an outermost peripheral portion that is electrically connected to the back gate region, and a connecting portion that connects the innermost peripheral portion and the outermost peripheral portion.

6. The semiconductor device of claim 1, further comprising: a LOCOS (Local Oxidation of Silicon) film that is in contact with the semiconductor layer, wherein the field plate overlaps the LOCOS film and the first interlayer insulating film.

7. The semiconductor device of claim 1, wherein the semiconductor layer further includes a source/gate region that is provided with the source region and a gate region electrically connected to the source region, the source/gate region being spaced apart from the drain region and located around the drain region.

8. The semiconductor device of claim 7, wherein the field plate includes an innermost peripheral portion that is electrically connected to the drain region, an outermost peripheral portion that is electrically connected to a ground, and a connecting portion that connects the innermost peripheral portion and the outermost peripheral portion.

9. The semiconductor device of claim 1, wherein the insulating film is a LOCOS (Local Oxidation of Silicon) film.

10. The semiconductor device of claim 1, wherein the field plate includes polysilicon.

11. The semiconductor device of claim 1, wherein the field plate includes chromium silicide.

12. The semiconductor device of claim 11, wherein the field plate has a thickness of 1 nm or more and 30 nm or less.

13. The semiconductor device of claim 11, further comprising:

a first conductive layer that is located over the first interlayer insulating film and is electrically connected to the field plate;

a second interlayer insulating film that covers the first conductive layer and the field plate; and a second conductive layer that is filled in an opening provided at the second interlayer insulating film and is electrically connected to the field plate, wherein the first conductive layer includes an exposed portion exposed from the field plate, and wherein the second conductive layer is in contact with the exposed portion.

14. A method of manufacturing a semiconductor device, comprising:

forming a semiconductor layer, which includes a drain region, a source region, a drift region, and a channel region, over a semiconductor substrate;

forming an insulating film that is in contact with the semiconductor layer and is located over the channel region;

forming a first interlayer insulating film that covers the insulating film;

forming a field plate that is located over the first interlayer insulating film and overlaps the drift region;

forming a second interlayer insulating film that covers the field plate;

forming a first opening in the first interlayer insulating film and the second interlayer insulating film;

forming a second opening, which exposes the field plate, in the second interlayer insulating film; and forming a first contact to be filled in the first opening and a second contact to be filled in the second opening.

15. The method of claim 14, wherein the field plate includes polysilicon.

16. The method of claim 14, further comprising: forming a gate electrode over the insulating film before forming the first interlayer insulating film.

17. A method of manufacturing a semiconductor device, comprising:

forming a semiconductor layer, which includes a drain region, a source region, a drift region, and a channel region, over a semiconductor substrate;

forming an insulating film that is in contact with the semiconductor layer and is located over the channel region;

forming a first interlayer insulating film that covers the insulating film;

forming a first opening in the first interlayer insulating film;

forming a contact to be filled in the first opening and a conductive layer located over the first interlayer insulating film;

forming a resistance layer that covers the first interlayer insulating film, the contact, and the conductive layer and includes chromium silicide; and forming a field plate including a covering portion covering the conductive layer by patterning the resistance layer.

18. The method of claim 17, wherein the field plate has a thickness of 1 nm or more and 30 nm or less.

19. The method of claim 17, further comprising:

forming a second interlayer insulating film that covers the field plate;

forming a second opening, which exposes the conductive layer, in the second interlayer insulating film by etching a portion of the second interlayer insulating film and the covering portion of the field plate; and forming a second contact to be filled in the second opening.

20. The method of claim 17, further comprising: forming a gate electrode over the insulating film before forming the first interlayer insulating film.

* * * * *